US012330394B2

(12) United States Patent
Kaneiwa et al.

(10) Patent No.: US 12,330,394 B2
(45) Date of Patent: Jun. 17, 2025

(54) LAMINATE AND IMAGE DISPLAY DEVICE

(71) Applicant: FUJIFILM Corporation, Tokyo (JP)

(72) Inventors: Hideki Kaneiwa, Kanagawa (JP); Naoki Koito, Kanagawa (JP); Takashi Katou, Kanagawa (JP); Takuya Inoue, Kanagawa (JP); Takehiro Kasahara, Kanagawa (JP)

(73) Assignee: FUJIFILM Corporation, Tokyo (JP)

( * ) Notice: Subject to any disclaimer, the term of this patent is extended or adjusted under 35 U.S.C. 154(b) by 257 days.

(21) Appl. No.: 18/177,575

(22) Filed: Mar. 2, 2023

(65) Prior Publication Data

US 2023/0202146 A1 Jun. 29, 2023

Related U.S. Application Data

(63) Continuation of application No. PCT/JP2021/033657, filed on Sep. 14, 2021.

(30) Foreign Application Priority Data

Sep. 15, 2020 (JP) .................................. 2020-154771
Sep. 10, 2021 (JP) .................................. 2021-147527

(51) Int. Cl.
*B32B 17/06* (2006.01)
*B32B 7/023* (2019.01)
*B32B 7/12* (2006.01)
*B32B 17/10* (2006.01)
*H10K 59/80* (2023.01)

(52) U.S. Cl.
CPC ............. *B32B 17/06* (2013.01); *B32B 7/023* (2019.01); *B32B 7/12* (2013.01); *B32B 17/10036* (2013.01); *B32B 17/10651* (2013.01); *B32B 17/10743* (2013.01); *H10K 59/8791* (2023.02); *B32B 2250/02* (2013.01); *B32B 2307/4026* (2013.01); *B32B 2307/42* (2013.01); *B32B 2457/208* (2013.01)

(58) Field of Classification Search
None
See application file for complete search history.

(56) References Cited

U.S. PATENT DOCUMENTS

| 2019/0071571 A1 | 3/2019 | Takada et al. |
| 2021/0175438 A1 | 6/2021 | Morita et al. |

FOREIGN PATENT DOCUMENTS

| EP | 3339008 A1 | 6/2018 | |
| JP | 2017134414 A * | 8/2017 | ............... B32B 7/12 |
| JP | 2020-084070 A | 6/2020 | |
| WO | 2017/195833 A1 | 11/2017 | |
| WO | 2020/031784 A1 | 2/2020 | |

OTHER PUBLICATIONS

Machine translation of JP 2017-134414 A (Year: 2017).*
Office Action, issued by the Japanese Patent Office on Apr. 9, 2024, in connection with Japanese Patent Application No. 2022-550558.
International Search Report issued in PCT/JP2021/033657 on Nov. 16, 2021.
Written Opinion issued in PCT/JP2021/033657 on Nov. 16, 2021.
International Preliminary Report on Patentability completed by WIPO on Mar. 21, 2023 in connection with International Patent Application No. PCT/JP2021/033657.
Office Action, issued by the Japanese Patent Office on Nov. 28, 2023, in connection with Japanese Patent Application No. 2022-550558.

* cited by examiner

*Primary Examiner* — Ramsey Zacharia
(74) *Attorney, Agent, or Firm* — Edwards Neils LLC; Jean C. Edwards, Esq.

(57) ABSTRACT

An object of the present invention is to provide a laminate capable of preparing an image display device having excellent display performance and excellent discoloration resistance, and an image display device formed of the laminate. The laminate of the present invention is a laminate including two substrates, and a polarizer layer disposed between the two substrates, in which the polarizer layer contains one or more kinds of azo coloring agents having two or more azo bonds in a molecule, moisture permeabilities of the two substrates are $10^{-3}$ g/m²·day or less, and a content of moisture present between the two substrates is 0.9 g/m² or less.

11 Claims, No Drawings

LAMINATE AND IMAGE DISPLAY DEVICE

CROSS-REFERENCE TO RELATED APPLICATIONS

This application is a Continuation of PCT International Application No. PCT/JP2021/033657 filed on Sep. 14, 2021, which was published under PCT Article 21(2) in Japanese, and which claims priority under 35 U.S.C. § 119 (a) to Japanese Patent Application No. 2020-154771 filed on Sep. 15, 2020 and Japanese Patent Application No. 2021-147527 filed on Sep. 10, 2021. The above applications are hereby expressly incorporated by reference, in their entirety, into the present application.

BACKGROUND OF THE INVENTION

1. Field of the Invention

The present invention relates to a laminate and an image display device.

2. Description of the Related Art

In the related art, in a case where an attenuation function, a polarization function, a scattering function, a light-shielding function of irradiation light including laser light or natural light is required, a device that is operated according to principles different for each function is used. Therefore, products corresponding to the above-described functions are also produced by production processes different for each function.

For example, a linear polarizer or a circular polarizer is used in an image display device (for example, a liquid crystal display device) to control optical revolution or birefringence in display. Further, a circular polarizer is used in an organic light emitting diode (OLED) to prevent reflection of external light.

In the related art, iodine has been widely used as a dichroic substance in these polarizers, but a polarizer that uses an organic coloring agent in place of iodine as a dichroic substance has also been examined.

For example, WO2017/195833A describes a light absorption anisotropic film (polarizer layer) formed of a composition containing a dichroic substance having a predetermined structure ([claim 1] and [claim 14]).

SUMMARY OF THE INVENTION

The present inventors found that in a case where the polarizer layer described in WO2017/195833A is prepared and sandwiched between substrates (for example, glass substrates) with a low moisture permeability from both sides, and the obtained laminate is exposed to a high-temperature condition for a long time according to an aspect for practical use (for example, a circularly polarizing plate for the purpose of antireflection of an organic electroluminescence type smartphone, a yellow discolored region is generated in a central portion of the laminate in the plane.

Further, as a result of examination repeatedly conducted by the present inventors, it was found that the degree of discoloration occurring in the central portion of the laminate varies depending on the composition of a pressure sensitive adhesive used for preparing the laminate and the conditions for preparing the laminate.

Therefore, an object of the present invention is to provide a laminate capable of preparing an image display device having excellent display performance and excellent discoloration resistance, and an image display device formed of the laminate.

As a result of intensive examination on the above-described problem, the present inventors found that the above-described problem can be solved by the following configurations.

[1] A laminate comprising: two substrates; and a polarizer layer disposed between the two substrates, in which the polarizer layer contains one or more kinds of azo coloring agents having two or more azo bonds in a molecule, moisture permeabilities of the two substrates are $10^{-3}$ g/m²·day or less, and a content of moisture present between the two substrates is 0.9 g/m² or less.

[2] The laminate according to [1], in which the content of moisture present between the two substrates is 0.7 g/m² or less.

[3] The laminate according to [1], in which the content of moisture present between the two substrates is 0.4 g/m² or less.

[4] The laminate according to any one of [1] to [3], further comprising: at least one pressure sensitive adhesive layer disposed between the two substrates.

[5] The laminate according to [4], in which a total content of a reducing agent in the at least one pressure sensitive adhesive layer is 0.04 g/m² or less.

[6] The laminate according to [4] or [5], in which each at least one pressure sensitive adhesive layer has a thickness of 100 μm or greater.

[7] A laminate comprising: two substrates; a polarizer layer disposed between the two substrates; and at least one pressure sensitive adhesive layer disposed between the two substrates, in which the polarizer layer contains one or more kinds of azo coloring agents having two or more azo bonds in a molecule, moisture permeabilities of the two substrates are $10^{-3}$ g/m²·day or less, and a total thickness of the at least one pressure sensitive adhesive layer is 70 μm or less.

[8] The laminate according to [7], in which a total content of a reducing agent in the at least one pressure sensitive adhesive layer is 0.04 g/m² or less.

[9] The laminate according to [7] or [8], in which the total thickness of the at least one pressure sensitive adhesive layer is 50 μm or greater.

[10] A laminate comprising: two substrates; a polarizer layer disposed between the two substrates; at least one layer of low moisture permeability, disposed between the two substrates; and at least one pressure sensitive adhesive layer disposed between the two substrates, in which the polarizer layer contains one or more kinds of azo coloring agents having two or more azo bonds in a molecule, moisture permeabilities of the two substrates are $10^{-3}$ g/m²·day or less, the at least one layer of low moisture permeability is disposed between the polarizer layer and the at least one pressure sensitive adhesive layer, and a moisture permeability of the at least one layer of low moisture permeability is 20 g/m2·day or less.

[11] The laminate according to [10], in which the at least one layer of low moisture permeability contains a cyclic polyolefin-based resin.

[12] The laminate according to [10] or [11], in which a total content of a reducing agent in the at least one pressure sensitive adhesive layer is 0.04 g/m² or less.

[13] The laminate according to any one of [1] to [12], in which both the two substrates are glass substrates.

[14] The laminate according to any one of [1] to [13], in which the two substrates each have a thickness of 100 to 1,100 μm.

[15] The laminate according to any one of [1] to [14], in which the azo coloring agent is a compound represented by Formula (1).

[16] An image display device comprising: the laminate according to any one of [1] to [15].

According to the present invention, it is possible to provide a laminate capable of preparing an image display device having excellent display performance and excellent discoloration resistance, and an image display device formed of the laminate.

DESCRIPTION OF THE PREFERRED EMBODIMENTS

Hereinafter, the present invention will be described in detail.

The description of constituent requirements described below may be made based on typical embodiments of the present invention, but the present invention is not limited to such embodiments.

In addition, in the present specification, a numerical range shown using "to" indicates a range including numerical values described before and after "to" as a lower limit and an upper limit.

Further, in the present specification, materials corresponding to respective components may be used alone or in combination of two or more kinds thereof. Here, in a case where two or more kinds of substances corresponding to respective components are used in combination, the content of the components indicates the total content of the combined substances unless otherwise specified.

Further, in the present specification, the definition for the substrate (for example, the thickness and the kind) denotes the common definition for two substrates unless otherwise specified.

Further, in the present specification, in a case where a plurality of pressure sensitive adhesive layers are present, the definition for the pressure sensitive adhesive layer (for example, the thickness and the content of the reducing agent) is the common definition for the plurality of pressure sensitive adhesive layers unless otherwise specified.

Further, in the present specification, in a case where a plurality of layers of low moisture permeability are present, the definition for the layer of low moisture permeability (for example, the thickness and the moisture permeability) is the common definition for the plurality of layers of low moisture permeability unless otherwise specified.

Further, in the present specification, "(meth)acrylate" is a notation representing "acrylate" or "methacrylate", "(meth) acryl" is a notation representing "acryl" or "methacryl", and "(meth)acryloyl" is a notation representing "acryloyl" or "methacryloyl".

<Laminate>

A laminate according to the embodiment of the present invention is a laminate according to first to third aspects described below.

A laminate according to the first aspect of the present invention is a laminate including two substrates, and a polarizer layer disposed between the two substrates, in which the polarizer layer contains one or more kinds of azo coloring agents having two or more azo bonds in a molecule, moisture permeabilities of the two substrates are $10^{-3}$ g/m$^2$·day or less, and the content of moisture present between the two substrates is 0.9 g/m$^2$ or less.

A laminate according to the second aspect of the present invention is a laminate including two substrates, a polarizer layer disposed between the two substrates, and at least one pressure sensitive adhesive layer disposed between the two substrates, in which the polarizer layer contains one or more kinds of azo coloring agents having two or more azo bonds in a molecule, moisture permeabilities of the two substrates are $10^{-3}$ g/m$^2$·day or less, and the total thickness of the at least one pressure sensitive adhesive layer is 70 μm or less.

A laminate according to a third aspect of the present invention is a laminate including two substrates, a polarizer layer disposed between the two substrates, at least one layer of low moisture permeability, disposed between the two substrates, and at least one pressure sensitive adhesive layer disposed between the two substrates, in which the polarizer layer contains one or more kinds of azo coloring agents having two or more azo bonds in a molecule, moisture permeabilities of the two substrates are $10^{-3}$ g/m$^2$·day or less, the at least one layer of low moisture permeability is disposed between the polarizer layer and the at least one pressure sensitive adhesive layer, and the moisture permeability of the at least one layer of low moisture permeability is 20 g/m$^2$·day or less.

Hereinafter, members constituting the laminate according to the first to third aspects of the present invention (hereinafter, also referred to as "laminate according to the embodiment of the present invention" in a case where a distinction is not required between the laminates) will be described in detail.

[Substrate]

The laminate according to the embodiment of the present invention includes two substrates.

The moisture permeability of the substrate is $10^{-3}$ g/m$^2$·day or less, and from the viewpoint of durability of an organic electroluminescence device, a liquid crystal display device, or the like to which the laminate according to the embodiment of the present invention is applied, the moisture permeability thereof is preferably $10^{-4}$ g/m$^2$·day or less and more preferably $10^{-5}$ g/m$^2$·day or less. The lower limit thereof is not particularly limited, but is $10^{-10}$ g/m$^2$·day or greater in many cases.

The method of measuring the moisture permeability of the substrate is as follows. The moisture permeability of the substrate is measured using a water vapor transmittance measuring device (AQUATRAN2 (registered trademark), manufactured by MOCON, INC.) under the conditions of a measurement temperature of 40° C. and a relative humidity of 90%.

The material constituting the substrate is not particularly limited and may be an inorganic substance or an organic substance.

The substrate is not particularly limited as long as the moisture permeability is lower than the specified value, and examples thereof include a glass substrate and a gas barrier film. More specific examples thereof include a glass substrate such as sealing glass used for an organic electroluminescence device, glass in a liquid crystal cell, or surface cover glass, and a gas barrier film such as a high barrier film or a barrier film used for an organic electroluminescence device.

The substrate may have a single-layer structure or a multi-layer structure.

In addition, one or a plurality of functional layers, such as a surface-cured layer (hard coat layer) and a low-reflection layer that suppresses surface reflection that occurs at the air interface, may be provided on a side of the surface of each substrate.

It is preferable that the substrate is transparent, that is, a so-called transparent substrate.

In the present specification, the term "transparent" denotes that the transmittance of visible light is 60% or greater, preferably 80% or greater, and more preferably 90% or greater. The upper limit thereof is not particularly limited, but is less than 100% in many cases.

In the present invention, from the viewpoint that the effects of the present invention are apparent, it is preferable that both the two substrates are glass substrates.

The thickness of the substrate is not particularly limited, but is preferably 1,100 μm or less, more preferably 700 μm or less, and still more preferably 500 μm or less from the viewpoint of reducing the thickness. The lower limit thereof is not particularly limited, but is preferably 10 μm or greater, more preferably 50 μm or greater, still more preferably 100 μm or greater, and particularly preferably 200 μm or greater.

In the present invention, from the viewpoint that the effects of the present invention are apparent, the thicknesses of the two substrates are preferably in a range of 100 to 1,100 μm, more preferably in a range of 100 to 700 μm, and still more preferably in a range of 200 to 500 μm.

[Polarizer Layer]

The laminate according to the embodiment of the present invention includes a polarizer layer.

The polarizer layer of the laminate according to the embodiment of the present invention contains one or more kinds of azo coloring agents (hereinafter, also formally referred to as "azo coloring agent of the present invention") having two or more azo bonds in a molecule.

It is preferable that the azo coloring agent of the present invention is a dichroic substance having dichroic properties. In the present invention, the dichroic substance denotes a coloring agent having different absorbances depending on the direction.

[Azo Coloring Agent]

The azo coloring agent of the present invention may or may not exhibit liquid crystallinity.

In a case where the azo coloring agent exhibits liquid crystallinity, the azo coloring agent may exhibit any of nematic or smectic liquid crystallinity. The temperature at which the liquid crystal phase is exhibited is preferably in a range of room temperature (approximately 20° C. to 28° C.) to 300° C. and from the viewpoints of handleability and manufacturing suitability, more preferably in a range of 50° C. to 200° C.

The azo coloring agent of the present invention is a nucleus and is preferably a compound that has a chromophore having two or more azo bonds and a side chain bonded to a terminal of the chromophore.

The chromogenic group has preferably a structure having an aromatic ring group (such as an aromatic hydrocarbon group or an aromatic heterocyclic group) in addition to the azo bonds, more preferably a bisazo or trisazo structure having an aromatic ring group and two or three azo bonds, and still more preferably a bisazo structure having an aromatic heterocyclic group (particularly preferably a thienothiazole group) and two azo bonds.

The side chain is not particularly limited, and examples thereof include a group represented by R1, R2, or R3 in Formula (1).

From the viewpoint of further improving the alignment degree of the polarizer layer and preparing an image display device with more excellent display performance and more excellent discoloration resistance (hereinafter, referred to as "the viewpoint that the effects of the present invention are more excellent"), it is preferable that the azo coloring agent of the present invention is a compound represented by Formula (1).

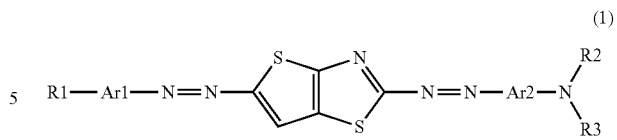

In Formula (1), Ar1 and Ar2 each independently represent a phenylene group which may have a substituent or a naphthylene group which may have a substituent. Among these, from the viewpoint that the effects of the present invention are more excellent, a phenylene group is preferable.

In Formula (1), R1 represents a hydrogen atom or an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent.

Examples of the alkyl group having a substituent as R1 include a group in which the carbon atoms of the alkyl group are substituted with —O—, —CO—, —C(O)—O—, —O—C(O)—, —Si(CH₃)₂—O—Si(CH₃)₂—, —N(R1')—, —N(R1')—CO—, —CO—N(R1')—, —N(R1')—C(O)—O—, —O—C(O)—N(R1')—, —N(R1')—C(O)—N(R1')—, —CH=CH—, —C≡C—, —N=N—, —C(R1')=CH—C(O)—, or —O—C(O)—O—. One or more carbon atoms or two or more carbon atoms of the alkyl group may be substituted with the above-described group.

The number of carbon atoms of the alkyl group as R1 is preferably in a range of 1 to 20, more preferably in a range of 2 to 18, still more preferably in a range of 4 to 14, and particularly preferably in a range of 8 to 12.

The alkyl group as R1 may have a linear, branched, or cyclic structure, but from the viewpoint that the effects of the present invention are more excellent, a linear structure or a branched structure is preferable, and a linear structure is more preferable.

In a case where R1 represents a group other than a hydrogen atom, the hydrogen atom in each group may be substituted with a halogen atom, a nitro group, a cyano group, —N(R1')₂, an amino group, —C(R1')=C(R1')-NO₂, —C(R1')=C(R1')-CN, or —C(R1')=C(CN)₂. One or more hydrogen atoms or two or more hydrogen atoms of each group may be substituted with the above-described group.

R1' represents a hydrogen atom or a linear or branched alkyl group having 1 to 6 carbon atoms. In a case where a plurality of R1's are present in each group, these may be the same as or different from one another.

In Formula (1), R2 and R3 each independently represent a hydrogen atom or an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent.

Examples of the alkyl group having a substituent as R2 and R3 include a group in which the carbon atoms of the alkyl group are substituted with —O—, —S—, —C(O)—, —C(O)—O—, —O—C(O)—, —C(O)—S—, —S—C(O)—, —Si(CH₃)₂—O—Si(CH₃)₂—, —NR2'-, —NR2'-CO—, —CO—NR2'-, —NR2'-C(O)—O—, —O—C—

(O)—NR2'—, —NR2'—C(O)—NR2'—, —CH═CH—, —C≡C—, —N═N—, —C(R2')═CH—C(O)—, or C(O)—O—. One or more carbon atoms or two or more carbon atoms of the alkyl group may be substituted with the above-described group.

The number of carbon atoms of the alkyl group as R2 and R3 is preferably in a range of 1 to 20, more preferably in a range of 1 to 16, still more preferably 1 to 8, and particularly preferably 1 to 4.

The alkyl group as R2 and R3 may have a linear, branched, or cyclic structure, but from the viewpoint that the effects of the present invention are more excellent, a linear structure or a branched structure is preferable, and a linear structure is more preferable.

In a case where R2 and R3 represent a group other than a hydrogen atom, the hydrogen atom of each group may be substituted with a halogen atom, a nitro group, a cyano group, a —OH group, —N(R2')$_2$, an amino group, —C(R2')═C(R2')-NO$_2$, —C(R2')═C(R2')-CN, or —C(R2')═C(CN)$_2$. One or more hydrogen atoms or two or more hydrogen atoms of each group may be substituted with the above-described group.

R2' represents a hydrogen atom or a linear or branched alkyl group having 1 to 6 carbon atoms. In a case where a plurality of (R2')'s are present in each group, these may be the same as or different from one another.

R2 and R3 may be bonded to each other to form a ring, or R2 or R3 may be bonded to Ar2 to form a ring.

From the viewpoint that the effects of the present invention are more excellent, it is preferable that R1 represents an electron-withdrawing group and that R2 and R3 represent a group with a low electron-donating property.

Specific examples of the group in which R1 represents an electron-withdrawing group include an alkylsulfonyl group, an alkylcarbonyl group, an alkyloxycarbonyl group, an acyloxy group, an alkylsulfonylamino group, an alkylsulfamoyl group, an alkylsulfinyl group, and an alkylureido group, and an alkyl group in which carbon atoms are substituted with —C(O)—O— and —O—, as R1. As the alkyl group in which carbon atoms are substituted with —C(O)—O— and —O—, a group represented by R11-C(O)—O—R12-O— is preferable. R11 represents a linear or branched alkyl group having 1 to 6 carbon atoms (preferably 1 to 3 carbon atoms), and R12 represents a linear or branched alkylene group having 1 to 20 carbon atoms (preferably 2 to 18 carbon atoms).

Specific examples of the group in which R2 and R3 represent a group having a low electron-donating property include groups having the following structures. In addition, the groups having the following structures are shown in the form having a nitrogen atom to which R2 and R3 are bonded in Formula (1).

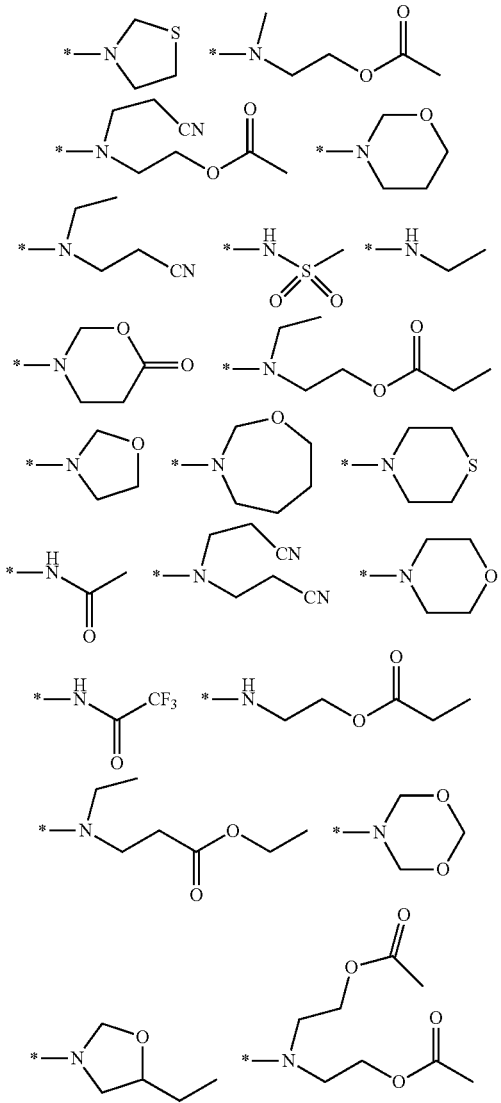

Specific examples of the azo coloring agent are shown below, but the present invention is not limited thereto.

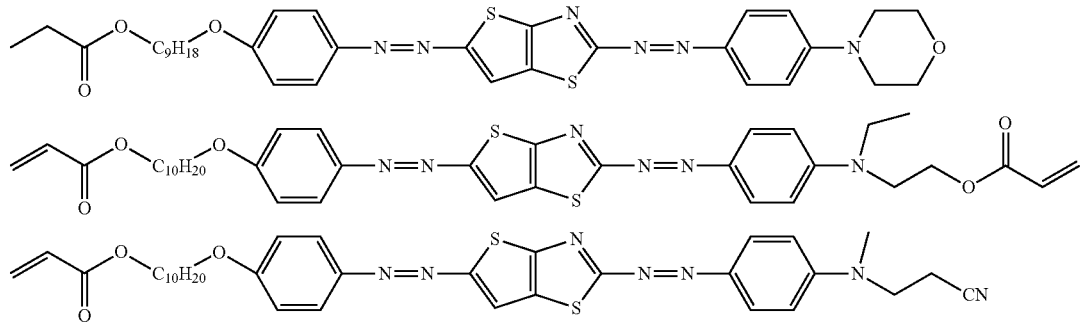

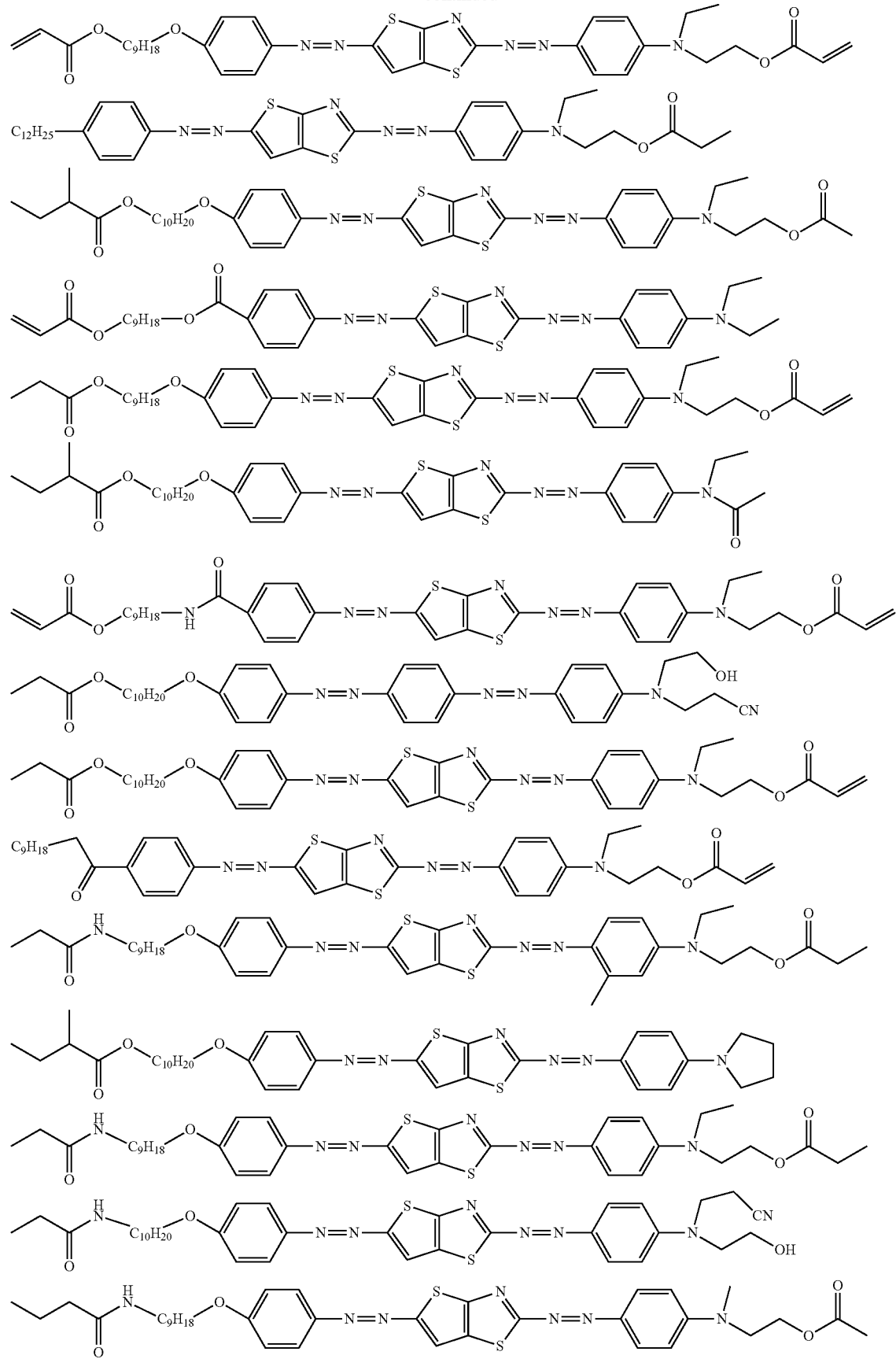

-continued

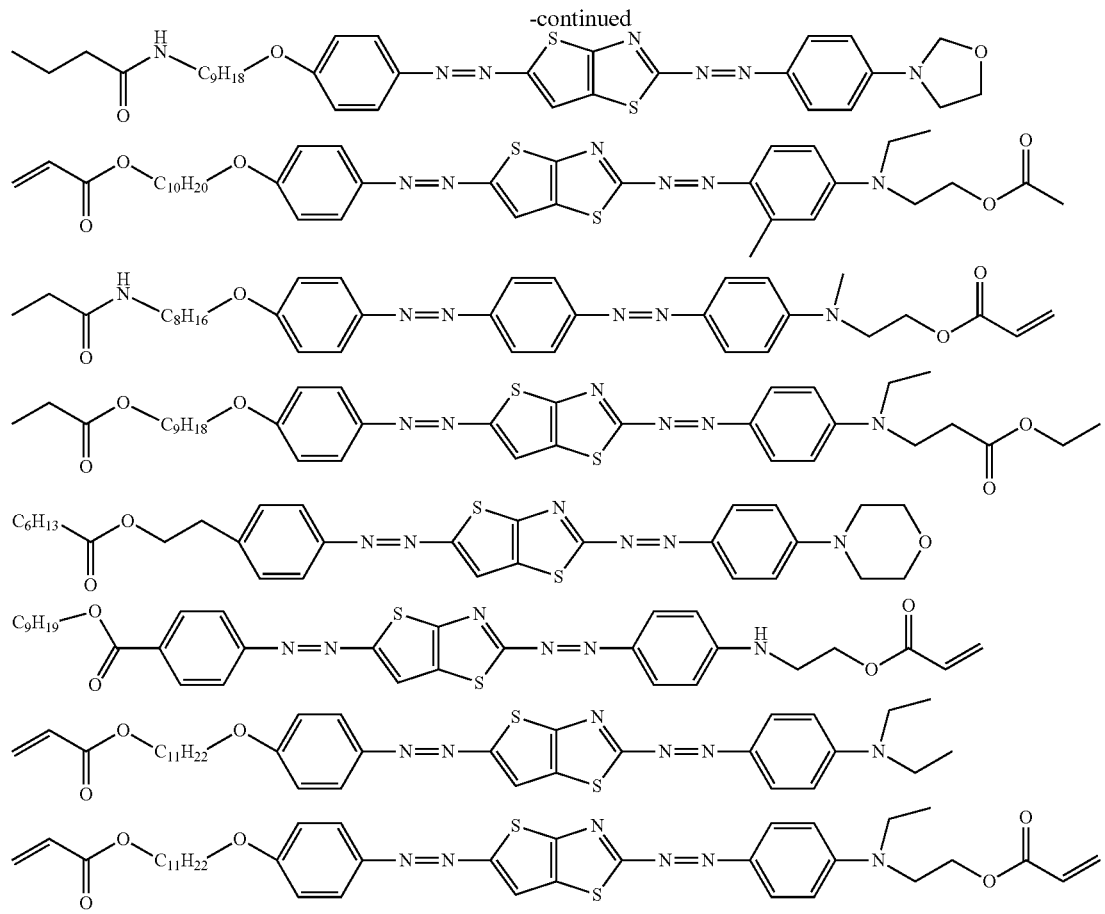

From the viewpoint of adjusting the tint of the polarizer, it is preferable that the azo coloring agent of the present invention has a maximum absorption wavelength in a wavelength range of 560 nm or greater and less than 700 nm (more preferably in a range of 560 to 650 nm and particularly preferably in a range of 560 to 640 nm).

The maximum absorption wavelength (nm) of the azo coloring agent in the present specification is acquired from an ultraviolet visible spectrum in a wavelength range of 380 to 800 nm measured by a spectrophotometer using a solution prepared by dissolving the azo coloring agent in a good solvent.

The polarizer layer may contain a plurality of azo coloring agents or may contain a dichroic substance in addition to the azo coloring agent. The azo coloring agent and the dichroic substance other than the azo coloring agent may or may not be polymerized in the polarizer layer.

The polarizer layer may include a low-molecular-weight liquid crystal compound and a polymer liquid crystal compound. Each of the low-molecular-weight liquid crystal compound and the polymer liquid crystal compound may or may not be polymerized in the polarizer layer.

The thickness of the polarizer layer is not particularly limited, but is preferably in a range of 100 to 8,000 nm and more preferably in a range of 300 to 5,000 nm from the viewpoint of the flexibility in a case where the laminate according to the embodiment of the present invention is used in a polarizer.

Examples of a method of producing the polarizer layer include a method of forming the polarizer layer by applying a composition for forming a polarizer which contains a liquid crystal compound, an azo coloring agent, and the like. Hereinafter, each component contained in the composition for forming a polarizer will be described in detail.

<Liquid Crystal Compound>

As the liquid crystal compound contained in the liquid crystal composition, both a polymer liquid crystal compound and a low-molecular-weight liquid crystal compound can be used, and a polymer liquid crystal compound is preferably used from the viewpoint of increasing the alignment degree.

Here, "polymer liquid crystal compound" denotes a liquid crystal compound having a repeating unit in the chemical structure.

Here, "low-molecular-weight liquid crystal compound" denotes a liquid crystal compound having no repeating units in the chemical structure.

Examples of the polymer liquid crystal compound include thermotropic liquid crystal polymers described in JP2011-237513A and polymer liquid crystal compounds described in paragraphs [0012] to [0042] of WO2018/199096A.

Examples of the low-molecular-weight liquid crystal compound include liquid crystal compounds described in paragraphs [0072] to [0088] of JP2013-228706A. Among these, a liquid crystal compound exhibiting smectic properties is preferable.

Further, as the liquid crystal compound, a polymer liquid crystal compound and a low-molecular-weight liquid crystal compound may be used in combination.

From the viewpoint of further increasing the alignment degree of the polarizer layer to be obtained, it is preferable that the liquid crystal compound is a polymer liquid crystal compound having a repeating unit represented by Formula (1) (hereinafter, also referred to as "repeating unit (1)").

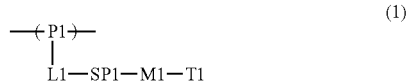
(1)

In Formula (1), P1 represents the main chain of the repeating unit, L1 represents a single bond or a divalent linking group, SP1 represents a spacer group, M1 represents a mesogen group, and T1 represents a terminal group.

Specific examples of the main chain of the repeating unit represented by P1 include groups represented by Formulae (P1-A) to (P1-D). Among these, from the viewpoints of diversity and handleability of a monomer serving as a raw material, a group represented by Formula (P1-A) is preferable.

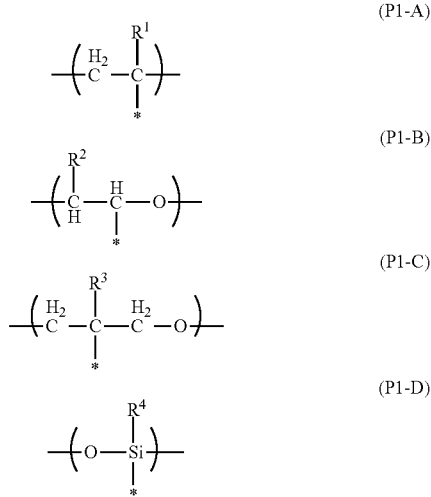

In Formulae (P1-A) to (P1-D), "*" represents a bonding position with respect to L1 in Formula (1).

In Formulae (P1-A) to (P1-D), $R^1$, $R^2$, $R^3$, and $R^4$ each independently represent a hydrogen atom, a halogen atom, a cyano group, an alkyl group having 1 to 10 carbon atoms, or an alkoxy group having 1 to 10 carbon atoms. The alkyl group may be a linear or branched alkyl group or an alkyl group having a cyclic structure (cycloalkyl group). Further, the number of carbon atoms of the alkyl group is preferably in a range of 1 to 5.

It is preferable that the group represented by Formula (P1-A) is a unit of a partial structure of poly(meth)acrylic acid ester obtained by polymerization of (meth)acrylic acid ester.

It is preferable that the group represented by Formula (P1-B) is an ethylene glycol unit formed by ring-opening polymerization of an epoxy group of a compound containing the epoxy group.

It is preferable that the group represented by Formula (P1-C) is a propylene glycol unit formed by ring-opening polymerization of an oxetane group of a compound containing the oxetane group.

It is preferable that the group represented by Formula (P1-D) is a siloxane unit of a polysiloxane obtained by polycondensation of a compound containing at least one of an alkoxysilyl group or a silanol group. Here, examples of the compound containing at least one of an alkoxysilyl group or a silanol group include a compound containing a group represented by Formula $SiR^{14}(OR^{15})_2$—. In the formula, $R^{14}$ has the same definition as that for $R^{14}$ in (P1-D), and a plurality of $R^{15}$'s each independently represent a hydrogen atom or an alkyl group having 1 to 10 carbon atoms.

In Formula (1), L1 represents a single bond or a divalent linking group.

Examples of the divalent linking group represented by L1 include —C(O)O—, —OC(O)—, —O—, —S—, —C(O)NR$^3$—, —NR$^3$C(O)—, —SO$_2$—, and —NR$^3$R$^4$—. In the formulae, $R^3$ and $R^4$ each independently represent a hydrogen atom or an alkyl group having 1 to 6 carbon atoms which may have a substituent.

In a case where P1 represents a group represented by Formula (P1-A), from the viewpoint of further increasing the alignment degree of the polarizer layer to be obtained, it is preferable that L1 represents a group represented by —C(O)O—.

In a case where P1 represents a group represented by any of Formulae (P1-B) to (P1-D), from the viewpoint of further increasing the alignment degree of the polarizer layer to be obtained, it is preferable that L1 represents a single bond.

In Formula (1), from the viewpoints of easily exhibiting liquid crystallinity and the availability of raw materials, it is preferable that the spacer group represented by SP1 has at least one structure selected from the group consisting of an oxyethylene structure, an oxypropylene structure, a polysiloxane structure, and an alkylene fluoride structure.

Here, as the oxyethylene structure represented by SP1, a group represented by *—(CH$_2$—CH$_2$O)$_{n1}$—* is preferable. In the formula, n1 represents an integer of 1 to 20, and "*" represents a bonding position with respect to L1 or M1 in Formula (1). From the viewpoint of further increasing the alignment degree of the polarizer layer to be obtained, n1 represents preferably an integer of 2 to 10, more preferably an integer of 2 to 4, and most preferably 3.

Further, from the viewpoint of further increasing the alignment degree of the polarizer layer to be obtained, a group represented by *—(CH(CH$_3$)—CH$_2$O)$_{n2}$—* is preferable as the oxypropylene structure represented by SP1. In the formula, n2 represents an integer of 1 to 3, and "*" represents a bonding position with respect to L1 or M1.

Further, from the viewpoint of further increasing the alignment degree of the polarizer layer to be obtained, a group represented by *—(Si(CH$_3$)$_2$—O)$_{n3}$—* is preferable as the polysiloxane structure represented by SP1. In the formula, n3 represents an integer of 6 to 10, and "*" represents a bonding position with respect to L1 or M1.

Further, from the viewpoint of further increasing the alignment degree of the polarizer layer to be obtained, a group represented by *—(CF$_2$—CF$_2$)$_{n4}$—* is preferable as the alkylene fluoride structure represented by SP1. In the formula, n4 represents an integer of 6 to 10, and "*" represents a bonding position with respect to L1 or M1.

In Formula (1), the mesogen group represented by M1 is a group showing a main skeleton of a liquid crystal molecule that contributes to liquid crystal formation. A liquid crystal molecule exhibits liquid crystallinity which is in an intermediate state (mesophase) between a crystal state and an isotropic liquid state. The mesogen group is not particularly limited and for example, particularly description on pages 7 to 16 of "FlussigeKristalle in Tabellen II" (VEB Deutsche Verlag fur Grundstoff Industrie, Leipzig, 1984) and particularly the description in Chapter 3 of "Liquid Crystal Handbook" (Maruzen, 2000) edited by Liquid Crystals Handbook Editing Committee can be referred to.

As the mesogen group, for example, a group having at least one cyclic structure selected from the group consisting of an aromatic hydrocarbon group, a heterocyclic group, and an alicyclic group is preferable.

From the viewpoint of further increasing the alignment degree of the polarizer layer to be obtained, the mesogen group contains preferably an aromatic hydrocarbon group, more preferably two to four aromatic hydrocarbon groups, and still more preferably three aromatic hydrocarbon groups.

From the viewpoints of exhibiting the liquid crystallinity, adjusting the liquid crystal phase transition temperature, and the availability of raw materials and synthetic suitability and from the viewpoint of further increasing the alignment degree of the polarizer layer to be obtained, as the mesogen group, a group represented by Formula (M1-A) or Formula (M1-B) is preferable, and a group represented by Formula (M1-B) is more preferable.

(M1-A)

(M1-B)

In Formula (M1-A), A1 represents a divalent group selected from the group consisting of an aromatic hydrocarbon group, a heterocyclic group, and an alicyclic group. These groups may be substituted with an alkyl group, a fluorinated alkyl group, an alkoxy group, or a substituent.

It is preferable that the divalent group represented by A1 is a 4- to 6-membered ring. Further, the divalent group represented by A1 may be a monocycle or a fused ring.

Further, "*" represents a bonding position with respect to SP1 or T1.

Examples of the divalent aromatic hydrocarbon group represented by A1 include a phenylene group, a naphthylene group, a fluorene-diyl group, an anthracene-diyl group, and a tetracene-diyl group. From the viewpoints of design diversity of a mesogenic skeleton and the availability of raw materials, a phenylene group or a naphthylene group is preferable, and a phenylene group is more preferable.

The divalent heterocyclic group represented by A1 may be any of aromatic or non-aromatic, but a divalent aromatic heterocyclic group is preferable as the divalent heterocyclic group from the viewpoint of further improving the alignment degree.

The atoms other than carbon constituting the divalent aromatic heterocyclic group include a nitrogen atom, a sulfur atom, and an oxygen atom. In a case where the aromatic heterocyclic group has a plurality of atoms constituting a ring other than carbon, these may be the same as or different from each other.

Specific examples of the divalent aromatic heterocyclic group include a pyridylene group (pyridine-diyl group), a pyridazine-diyl group, an imidazole-diyl group, a thienylene group (thiophene-diyl group), a quinolylene group (quinoline-diyl group), an isoquinolylene group (isoquinoline-diyl group), an oxazole-diyl group, a thiazole-diyl group, an oxadiazole-diyl group, a benzothiazole-diyl group, a benzothiadiazole-diyl group, a phthalimido-diyl group, a thienothiazole-diyl group, a thiazolothiazole-diyl group, a thienothiophene-diyl group, and a thienooxazole-diyl group.

Specific examples of the divalent alicyclic group represented by A1 include a cyclopentylene group and a cyclohexylene group.

In Formula (M1-A), a1 represents an integer of 1 to 10. In a case where a1 represents 2 or greater, a plurality of A1's may be the same as or different from each other.

In Formula (M1-B), A2 and A3 each independently represent a divalent group selected from the group consisting of an aromatic hydrocarbon group, a heterocyclic group, and an alicyclic group. Specific examples and preferred embodiments of A2 and A3 are the same as those for A1 in Formula (M1-A), and thus description thereof will not be repeated.

In Formula (M1-B), a2 represents an integer of 1 to 10. In a case where a2 represents 2 or greater, a plurality of A2's may be the same as or different from each other, a plurality of A3's may be the same as or different from each other, and a plurality of LA1's may be the same as or different from each other. From the viewpoint of further increasing the alignment degree of the polarizer layer to be obtained, a2 represents preferably an integer of 2 or greater and more preferably 2.

In Formula (M1-B), in a case where a2 represents 1, LA1 represents a divalent linking group. In a case where a2 represents 2 or greater, a plurality of LA1's each independently represent a single bond or a divalent linking group, and at least one of the plurality of LA1's is a divalent linking group. In a case where a2 represents 2, from the viewpoint of further increasing the alignment degree of the polarizer layer to be obtained, it is preferable that one of the two LA1's represents a divalent linking group and the other represents a single bond.

In Formula (M1-B), examples of the divalent linking group represented by LA1 include —O—, —(CH$_2$)$_g$—, —(CF$_2$)$_g$—, —Si(CH$_3$)$_2$—, —(Si(CH$_3$)$_2$O)$_g$—, —(OSi(CH$_3$)$_2$)$_g$— (g represents an integer of 1 to 10), —N(Z)—, —C(Z)=C(Z')—, —C(Z)=N—, —N=C(Z)—, —C(Z)$_2$—C(Z')$_2$—, —C(O)—, —OC(O)—, —C(O)O—, —O—C(O)O—, —N(Z)C(O)—, —C(O)N(Z)—, —C(Z)=C(Z')—C(O)O—, —O—C(O)—C(Z)=C(Z')—, —C(Z)=N—, —N=C(Z)—, —C(Z)=C(Z')—C(O)N(Z")—, —N(Z")—C(O)—C(Z)=C(Z')—, —C(Z)=C(Z')—C(O)—S—, —S—C(O)—C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —S(O)—, —S(O)(O)—, —(O)S(O)O—, —O(O)S(O)O—, —SC(O)—, and —C(O)S—. Among these, from the viewpoint of further increasing the alignment degree of the polarizer layer to be obtained, —C(O)O— is preferable. LA1 may represent a group obtained by combining two or more of these groups.

Specific examples of M1 include the following structures. In the following specific examples, "Ac" represents an acetyl group.

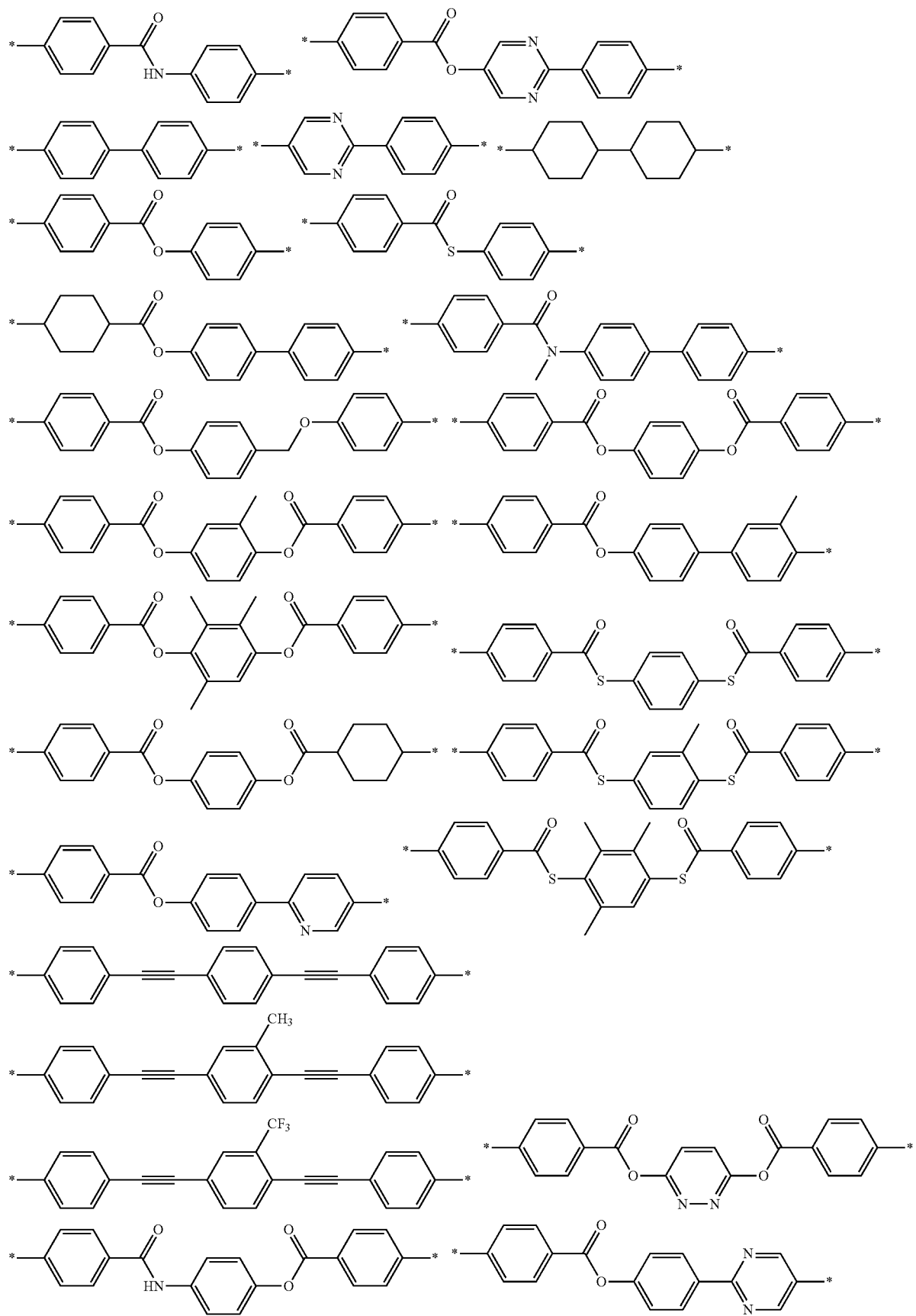

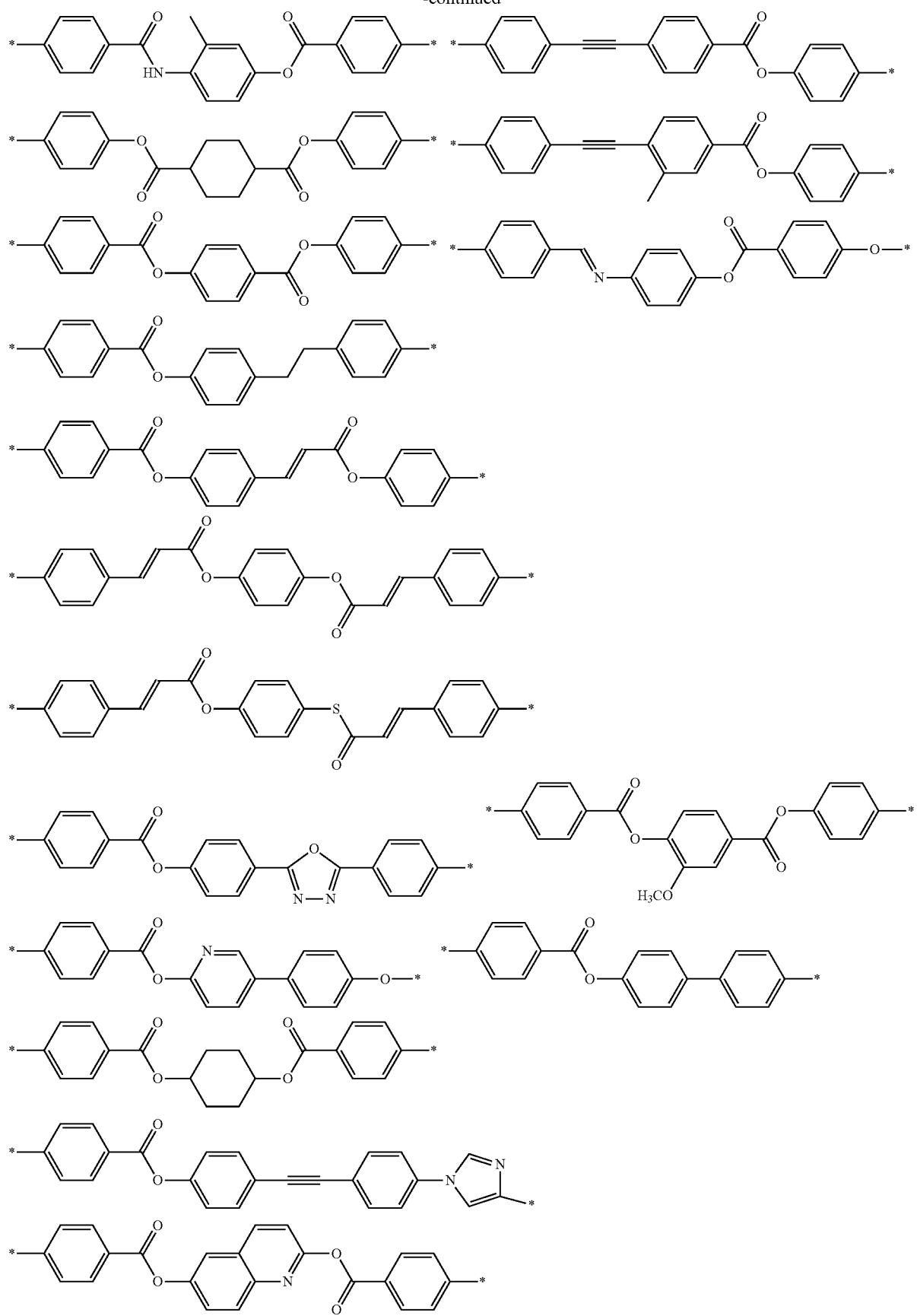

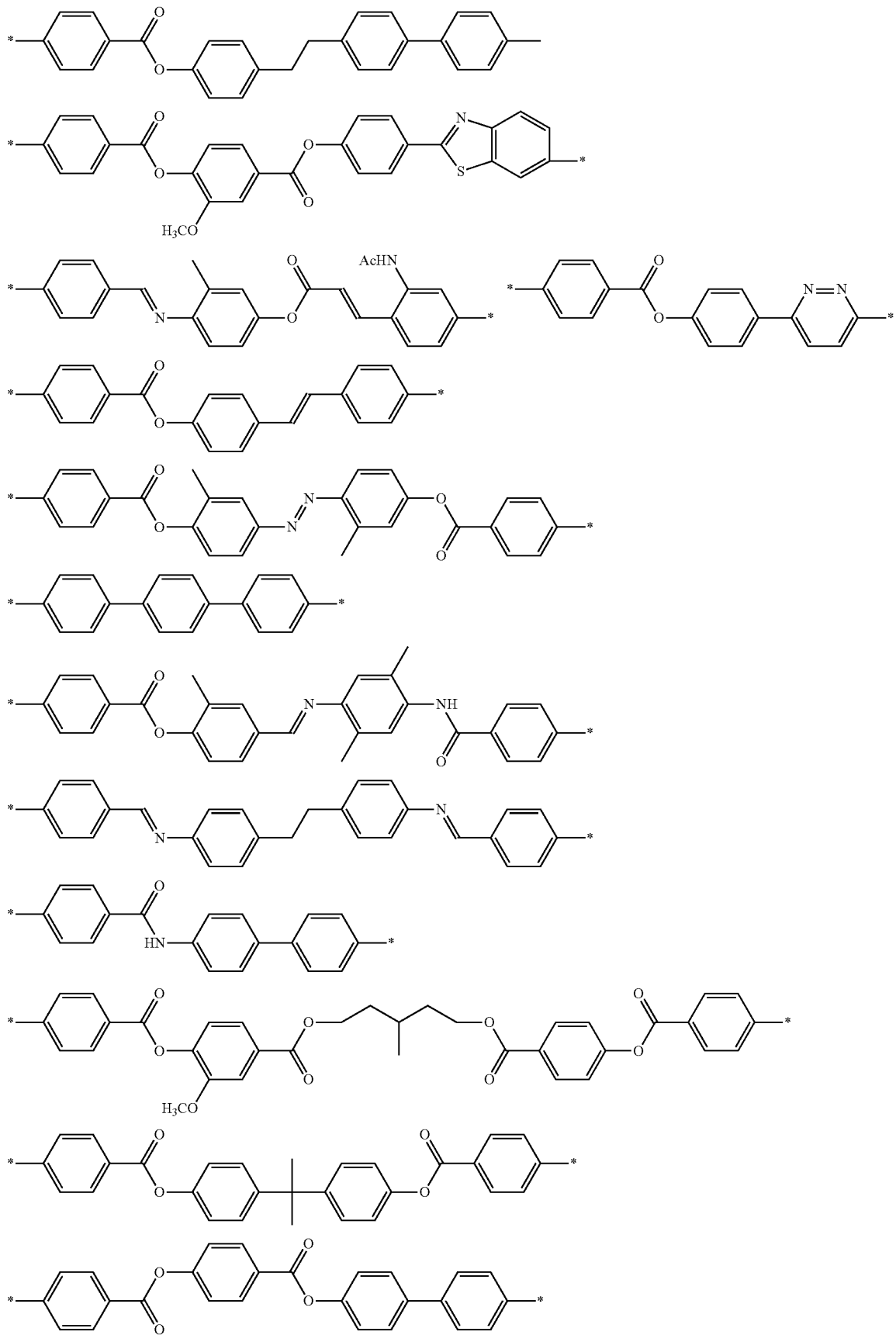

-continued
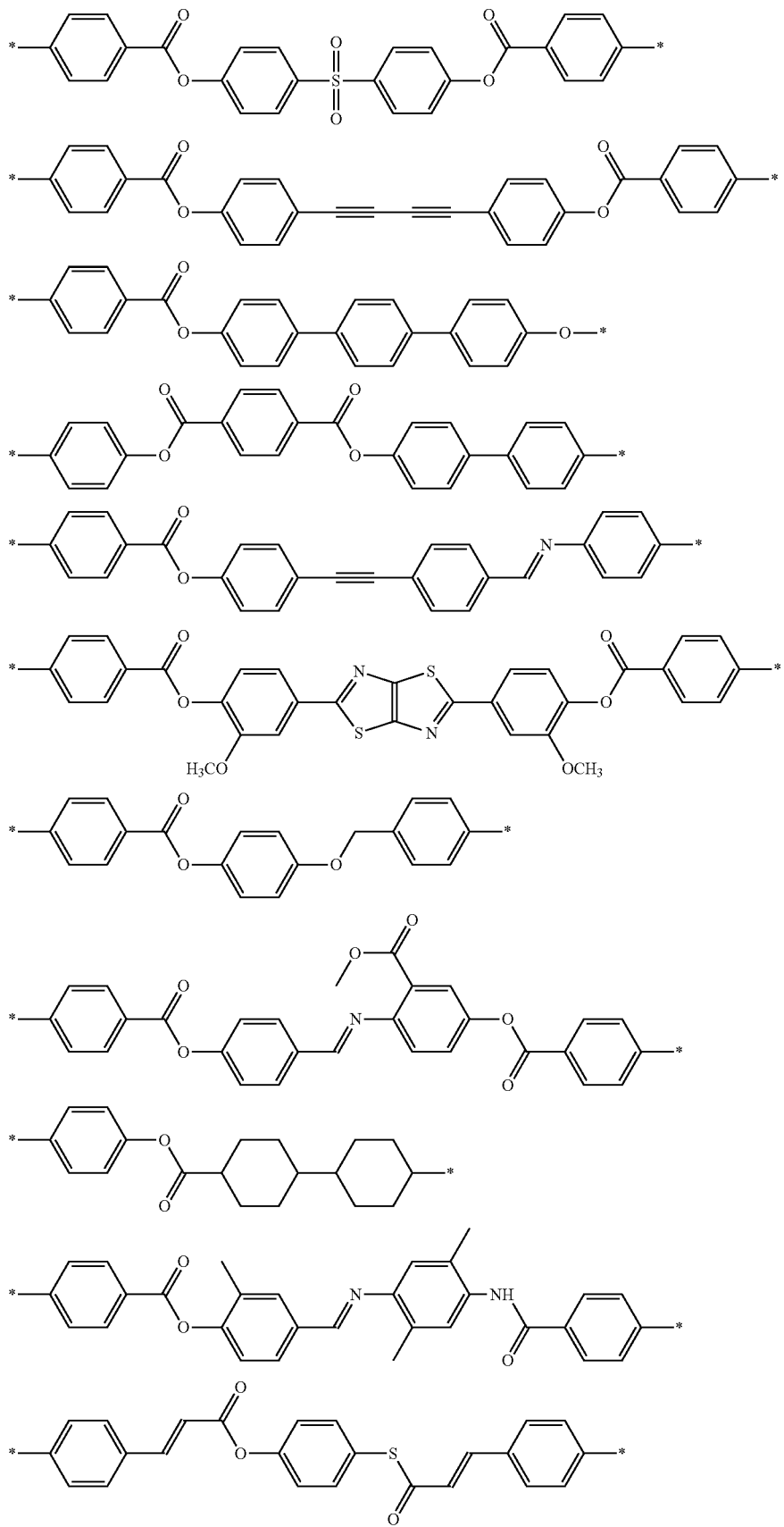

-continued

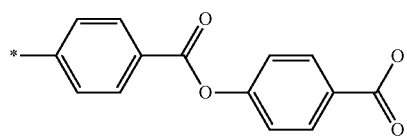

In Formula (1), examples of the terminal group represented by T1 include a hydrogen atom, a halogen atom, a cyano group, a nitro group, a hydroxy group, an alkyl group having 1 to 10 carbon atoms, an alkoxy group having 1 to 10 carbon atoms, an alkylthio group having 1 to 10 carbon atoms, an alkoxycarbonyloxy group having 1 to 10 carbon atoms, an alkoxycarbonyl group having 1 to 10 carbon atoms (ROC(O)—: R represents an alkyl group), an acyloxy group having 1 to 10 carbon atoms, an acylamino group having 1 to 10 carbon atoms, an alkoxycarbonylamino group having 1 to 10 carbon atoms, a sulfonylamino group having 1 to 10 carbon atoms, a sulfamoyl group having 1 to 10 carbon atoms, a carbamoyl group having 1 to 10 carbon atoms, a sulfinyl group having 1 to 10 carbon atoms, a ureido group having 1 to 10 carbon atoms, and a (meth)acryloyloxy group-containing group. Examples of the (meth)acryloyloxy group-containing group include a group represented by -L-A (L represents a single bond or a linking group, specific examples of the linking group are the same as those for L1 and SP1 described above, and A represents a (meth)acryloyloxy group).

From the viewpoint of further increasing the alignment degree of the polarizer layer to be obtained, T1 represents preferably an alkoxy group having 1 to 10 carbon atoms, more preferably an alkoxy group having 1 to 5 carbon atoms, and still more preferably a methoxy group.

These terminal groups may be further substituted with these groups or the polymerizable groups described in JP2010-244038A.

From the viewpoint of further enhancing the adhesiveness of the film to the adjacent layer and improving the adhesive strength of the film, it is preferable that T1 represents a polymerizable group.

Here, the polymerizable group is not particularly limited, but a polymerizable group capable of radical polymerization or cationic polymerization is preferable.

As the radically polymerizable group, a generally known radically polymerizable group can be used, and suitable examples thereof include an acryloyl group and a methacryloyl group. In this case, since the acryloyl group is generally known to have a higher polymerization rate, the acryloyl group is preferable from the viewpoint of improving productivity, but the methacryloyl group can also be used as the polymerizable group.

As the cationically polymerizable group, a generally known cationically polymerizable group can be used, and specific examples thereof include an alicyclic ether group, a cyclic acetal group, a cyclic lactone group, a cyclic thioether group, a spiroorthoester group, and a vinyloxy group. Among these, an alicyclic ether group or a vinyloxy group is suitable, and an epoxy group, an oxetanyl group, or a vinyloxy group is particularly preferable.

From the viewpoint of further increasing the alignment degree of the polarizer layer to be obtained, the weight-average molecular weight (Mw) of the polymer liquid crystal compound having a repeating unit represented by Formula (1) is preferably in a range of 1,000 to 500,000 and more preferably in a range of 2,000 to 300,000. In a case where the Mw of the polymer liquid crystal compound is in the above-described range, the polymer liquid crystal compound is easily handled.

In particular, from the viewpoint of suppressing cracking during the coating, the weight-average molecular weight (Mw) of the polymer liquid crystal compound is preferably 10000 or greater and more preferably in a range of 10,000 to 300,000.

In addition, from the viewpoint of the temperature latitude of the alignment degree, the weight-average molecular weight (Mw) of the polymer liquid crystal compound is preferably less than 10,000 and preferably 2,000 or greater and less than 10,000.

Here, the weight-average molecular weight and the number average molecular weight in the present invention are values measured according to gel permeation chromatography (GPC).

Solvent (eluent): N-methylpyrrolidone
Equipment name: TOSOH HLC-8220GPC
Column: Connect and use three of TOSOH TSKgel Super AWM-H (6 mm×15 cm)
Column temperature: 25° C.
Sample concentration: 0.1% by mass
Flow rate: 0.35 mL/min
Calibration curve: TSK standard polystyrene (manufactured by TOSOH Corporation), calibration curves of 7 samples with Mw of 2,800,000 to 1,050 (Mw/Mn=1.03 to 1.06) are used.

In the present invention, from the viewpoint that the compatibility with the azo coloring agent described above or the dichroic substance described below is easily adjusted, the log P value of the liquid crystal compound is preferably in a range of 0.0 to 10, more preferably in a range of 1.0 to 7.0, and still more preferably in a range of 2.0 to 5.0.

Here, the log P value is an index for expressing the properties of the hydrophilicity and hydrophobicity of a chemical structure and is also referred to as a hydrophilic-hydrophobic parameter. The log P value can be calculated using software such as ChemBioDrawUltra or HSPiP (Ver. 4.1.07). Further, the log P value can be acquired experimentally by the method of the OECD Guidelines for the Testing of Chemicals, Sections 1, Test No. 117 or the like. In the present invention, a value calculated by inputting the structural formula of a compound to HSPiP (Ver. 4.1.07) is employed as the log P value unless otherwise specified.

In the present invention, the content of the liquid crystal compound is preferably in a range of 8% to 99% by mass and more preferably in a range of 8% to 96% by mass with respect to the solid content of the composition for forming a polarizer.

Here, "solid content in the composition for forming a polarizer" denotes components from which solvents are removed, and specific examples of the solid content include the liquid crystal compound and the azo coloring agent described above, and a dichroic substance, a polymerization initiator, and a surfactant described below.

<Azo Coloring Agent>

The azo coloring agent contained in the composition for forming a polarizer is the same coloring agent as the above-described azo coloring agent of the present invention.

The composition for forming a polarizer may contain a plurality of the above-described azo coloring agents.

In a case where the composition for forming a polarizer contains a plurality of azo coloring agents, from the viewpoint of making the color of the polarizer layer to be obtained closer to black, it is preferable that at least one azo coloring agent having a maximum absorption wavelength in a wavelength range of 560 nm or greater and less than 700 nm and at least one azo coloring agent having a maximum absorption wavelength in a wavelength range of 370 nm or greater and less than 560 nm are used in a combination.

The azo coloring agent may contain a crosslinkable group. Specific examples of the crosslinkable group include a (meth)acryloyl group, an epoxy group, an oxetanyl group, and a styryl group. Among these, a (meth)acryloyl group is preferable.

<Dichroic Substance>

The composition for forming a polarizer may contain a dichroic substance other than the azo coloring agent. The dichroic substance other than the azo coloring agent may also contain a crosslinkable group.

Specific examples of the crosslinkable group include a (meth)acryloyl group, an epoxy group, an oxetanyl group, and a styryl group. Among these, a (meth)acryloyl group is preferable.

The dichroic substance contained in the composition for forming a polarizer is not particularly limited, and examples thereof include a visible light absorbing substance (dichroic coloring agent), a light emitting substance (such as a fluorescent substance or a phosphorescent substance), an ultraviolet absorbing substance, an infrared absorbing substance, a non-linear optical substance, a carbon nanotube, and an inorganic substance (for example, a quantum rod). Further, known dichroic substances (dichroic coloring agents) of the related art can be used.

Specific examples thereof include those described in paragraphs [0067] to [0071] of JP2013-228706A, paragraphs [0008] to [0026] of JP2013-227532A, paragraphs [0008] to [0015] of JP2013-209367A, paragraphs [0045] to [0058] of JP2013-14883A, paragraphs [0012] to [0029] of JP2013-109090A, paragraphs [0009] to [0017] of JP2013-101328A, paragraphs [0051] to [0065] of JP2013-37353A, paragraphs [0049] to [0073] of JP2012-63387A, paragraphs [0016] to [0018] of JP1999-305036A (JP-H11-305036A), paragraphs [0009] to [0011] of JP2001-133630A, paragraphs [0030] to [0169] of JP2011-215337A, paragraphs [0021] to [0075] of JP2010-106242A, paragraphs [0011] to [0025] of JP2010-215846A, paragraphs [0017] to [0069] of JP2011-048311A, paragraphs [0013] to [0133] of JP2011-213610A, paragraphs [0074] to [0246] of JP2011-237513A, paragraphs [0005] to [0051] of JP2016-006502A, paragraphs [0005] to [0041] of WO2016/060173A, paragraphs [0008] to [0062] of WO2016/136561A, paragraphs [0014] to [0033] of WO2017/154835A, paragraphs [0014] to [0033] of WO2017/154695A, paragraphs [0013] to [0037] of WO2017/195833A, paragraphs [0014] to [0034] of WO2018/164252A, paragraphs [0021] to [0030] of WO2018/186503A, paragraphs [0043] to [0063] of WO2019/189345A, paragraphs [0043] to [0085] of WO2019/225468A, and paragraphs [0050] to [0074] of WO2020/004106A.

The composition for forming a polarizer may contain a combination of two or more kinds of dichroic substances other than the above-described azo coloring agent.

In the present invention, from the viewpoint of further enhancing the display performance and the durability of the image display device, a difference between the log P value of the azo coloring agent and the log P value of the liquid crystal compound is preferably 5.0 or greater, more preferably 7.0 or greater, and still more preferably 7.0 or greater and less than 10.0.

Here, in a case where a plurality of azo coloring agents or a plurality of liquid crystal compounds are used, the difference (absolute value) between the log P value of the azo coloring agent and the log P value of the liquid crystal compound denotes the maximum difference from among differences calculated from log P values of the compounds.

From the viewpoint that the effects of the present invention are more excellent, the content of the azo coloring agent and the dichroic substance other than the azo coloring agent is preferably in a range of 1 to 400 parts by mass, more preferably in a range of 2 to 100 parts by mass, and still more preferably in a range of 5 to 30 parts by mass with respect to 100 parts by mass of the liquid crystal compound.

Further, the content of the azo coloring agent and the dichroic substance other than the azo coloring agent is preferably in a range of 1% to 50% by mass and more preferably in a range of 2% to 40% by mass with respect to the solid content in the composition for forming a polarizer layer.

<Polymerization Initiator>

It is preferable that the composition for forming a polarizer layer contains a polymerization initiator.

The polymerization initiator is not particularly limited, but a compound having photosensitivity, that is, a photopolymerization initiator is preferable.

As the photopolymerization initiator, various compounds can be used without any particular limitation. Examples of the photopolymerization initiator include α-carbonyl compounds (U.S. Pat. Nos. 2,367,661A and 2,367,670A), acyloin ether (U.S. Pat. No. 2,448,828A), α-hydrocarbon-substituted aromatic acyloin compounds (U.S. Pat. No. 2,722,512A), polynuclear quinone compounds (U.S. Pat. Nos. 3,046,127A and 2,951,758A), a combination of a triarylimidazole dimer and a p-aminophenyl ketone (U.S. Pat. No. 3,549,367A), acridine and phenazine compounds (JP1985-105667A (JP-S60-105667A) and U.S. Pat. No. 4,239,850A), oxadiazole compounds (U.S. Pat. No. 4,212,970A), o-acyloxime compounds (paragraph [0065] of JP2016-27384A), and acylphosphine oxide compounds (JP1988-40799B (JP-S63-40799B), JP1993-29234B (JP-H5-29234B), JP1998-95788A (JP-H10-95788A), and JP1998-29997A (JP-H10-29997A)).

Commercially available products can also be used as such a photopolymerization initiator, and examples thereof include IRGACURE 184, IRGACURE 907, IRGACURE 369, IRGACURE 651, IRGACURE 819, IRGACURE OXE-01, and IRGACURE OXE-02 (all manufactured by BASF SE).

In a case where the composition for forming a polarizer layer contains a polymerization initiator, the content of the polymerization initiator is preferably in a range of 0.01 to 30 parts by mass and more preferably in a range of 0.1 to 15 parts by mass with respect to 100 parts by mass of the total amount of the azo coloring agent, the dichroic substance other than the azo coloring agent, and the liquid crystal compound in the composition for forming a polarizer layer. The durability of the polarizer layer is enhanced in a case where the content of the polymerization initiator is 0.01 parts by mass or greater, and the alignment degree of the polarizer layer is further enhanced in a case where the content thereof is 30 parts by mass or less.

The polymerization initiator may be used alone or in combination of two or more kinds thereof. In a case where the composition contains two or more kinds of polymerization initiators, it is preferable that the total amount of the polymerization initiators is in the above-described ranges.

<Surfactant>

It is preferable that the composition for forming a polarizer layer contains a surfactant.

In a case where the liquid crystal composition contains a surfactant, the smoothness of the coated surface is improved, the alignment degree is further improved, and cissing and unevenness are suppressed so that the in-plane uniformity is expected to be improved.

As the surfactant, surfactants that allow dichroic substances and liquid crystal compounds to be horizontally aligned on the coated surface side are preferable, and examples thereof include the compounds described in paragraphs [0155] to [0170] of WO2016/009648A and the compounds (horizontal alignment agents) described in paragraphs [0253] to [0293] of JP2011-237513A.

The surfactant contained in the composition for forming a polarizer layer of the present invention may be a fluorine-containing polymer having a repeating structure B1 represented by Formula (B-1) and a repeating structure B2 having a fluorine atom.

(Repeating Structure B1)

The repeating structure B1 of the fluorine-containing polymer is a repeating structure represented by Formula (B-1).

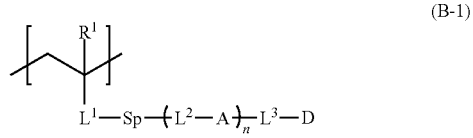

(B-1)

In Formula (B-1), $R^1$ represents a hydrogen atom, an alkyl group having 1 to 5 carbon atoms, or a halogen atom.

Further, $L^1$ represents a single bond or —CO—.

In addition, Sp represents a linear or branched divalent hydrocarbon group having 1 to 20 carbon atoms. Here, one or two or more —CH$_2$-'s that are not adjacent to each other among —CH$_2$-'s constituting a part of a hydrocarbon group may be each independently substituted with —O—, —S—, —NH—, or —N(Q)-, and Q represents a substituent.

$L^2$ and $L^3$ each independently represent a single bond or a divalent linking group.

$R^1$ in Formula (B-1) represents preferably a hydrogen atom or an alkyl group having 1 to 5 carbon atoms and more preferably a hydrogen atom or a methyl group.

It is preferable that $L^1$ in Formula (B-1) represents —CO—.

Examples of the linear or branched divalent hydrocarbon group having 1 to 20 carbon atoms represented by Sp in Formula (B-1) include a linear or branched divalent aliphatic hydrocarbon group having 1 to 20 carbon atoms, a divalent alicyclic hydrocarbon group having 3 to 20 carbon atoms, a divalent aromatic hydrocarbon group having 6 to 20 carbon atoms, and a divalent aromatic heterocyclic group having 6 to 20 carbon atoms. Among these, a linear or branched divalent aliphatic hydrocarbon group having 1 to 20 carbon atoms is preferable.

Here, as the divalent aliphatic hydrocarbon group having 1 to 20 carbon atoms, an alkylene group having 1 to 15 carbon atoms is preferable, and an alkylene group having 1 to 8 carbon atoms is more preferable, and specific suitable examples thereof include a methylene group, an ethylene group, a propylene group, a butylene group, a pentylene group, a hexylene group, a methylhexylene group, and a heptylene group.

As described above, one or two or more —CH$_2$-'s that are not adjacent to each other among —CH$_2$-'s constituting a part of a linear or branched divalent hydrocarbon group having 1 to 20 carbon atoms as Sp may be each independently substituted with —O—, —S—, —NH—, or —N(Q)-. Further, examples of the substituent represented by Q include the above-described substituent W. Among these, an alkyl group, an alkoxy group, or a halogen atom is preferable.

Examples of the divalent linking group represented by one aspect of $L^2$ and $L^3$ in Formula (B-1) include —C(O)O—, —OC(O)—, —O—, —S—, —C(O))NR$^{L1}$—, —NR$^{L1}$C(O)—, —SO$_2$—, and —NR$^{L1}$R$^{L2}$—. In the formulae, R$^{L1}$ and R$^{L2}$ each independently represent a hydrogen atom or an alkyl group having 1 to 6 carbon atoms which may have a substituent. Further, examples of the substituent that the alkyl group having 1 to 6 carbon atoms may have include the above-described substituent W. Among these, an alkyl group, an alkoxy group, or a halogen atom is preferable.

In Formula (B-1), A represents a divalent linking group represented by any of Formulae (A-1) to (A-15). Here, "*" in Formulae (A-1) to (A-15) represents a bonding position with respect to $L^2$ or $L^3$, and the carbon atoms constituting the ring structures in Formulae (A-1) to (A-15) may be substituted with heteroatoms or may have substituents. In addition, examples of the substituents that the carbon atoms constituting the ring structures may have include the above-described substituent W. Among these, an alkyl group, an alkoxy group, or a halogen atom is preferable.

(A-1)

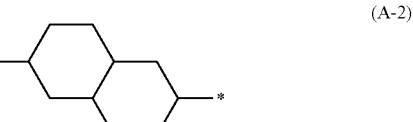

(A-2)

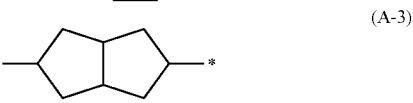

(A-3)

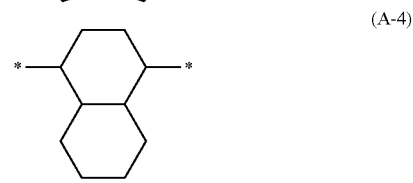

(A-4)

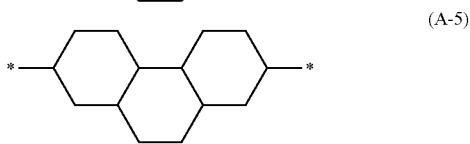

(A-5)

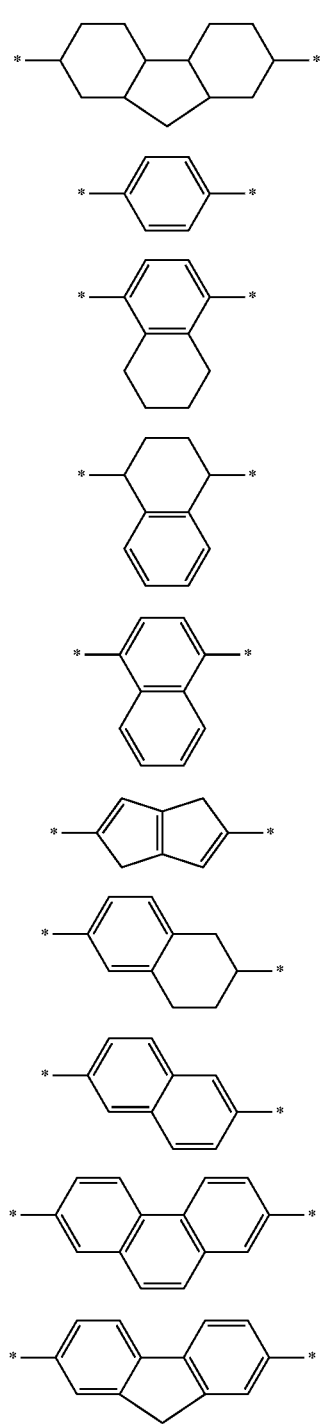

(A-6)
(A-7)
(A-8)
(A-9)
(A-10)
(A-11)
(A-12)
(A-13)
(A-14)
(A-15)

Specific examples of the divalent linking group represented by any of Formulae (A-1) to (A-15) include a 1,4-phenylene group, a 1,4-cyclohexylene group, a 1,4-cyclohexenyl group, a tetrahydropyran-2,5-diyl group, a 1,4-piperazine group, a 1,4-piperidine group, a 1,3-dioxane-2,5-diyl group, a tetrahydrothiopyran-2,5-diyl group, a 1,4-bicyclo(2,2,2)octylene group, a decahydronaphthalene-2,6-diyl group, a pyridine-2,5-diyl group, a pyrimidine-2,5-diyl group, a pyrazine-2,5-diyl group, a 1,2,3,4-tetrahydronaphthalene-2,6-diyl group, a 2,6-naphthylene group, a phenanthrene-2,7-diyl group, a 9,10-dihydrophenanthrene-2,7-diyl group, a 1,2,3,4,4a,9,10a-octahydrophenanthrene-2,7-diyl group, a 9-fluorenone-2,7-diyl group, a fluorene-2,7-diyl group, a thienothiophene-3,6-diyl group, a carbazole-3,6-diyl group, and a carbazole-2,7-diyl group.

In Formula (B-1), from the viewpoint of further increasing the alignment degree of the polarizer layer to be formed, A represents preferably a divalent linking group represented by any of Formulae (A-1), (A-4), (A-7), (A-10), and (A-13) and more preferably a divalent linking group represented by any of Formulae (A-7) and (A-13).

In Formula (B-1), D represents a hydrogen-bonding group formed of a hydrogen atom and a non-metal atom of Groups 14 to 16. Further, the non-metal atom may have a substituent.

Here, examples of the non-metal atoms of Groups 14 to 16 include an oxygen atom, a sulfur atom, a nitrogen atom, and a carbon atom.

Further, examples of the substituent that the non-metal atom (particularly, the nitrogen atom and the carbon atom) may have include a halogen atom, an alkyl group, an alkoxy group, an alkyl-substituted alkoxy group, a cyclic alkyl group, an aryl group (such as a phenyl group or a naphthyl group), a cyano group, an amino group, a nitro group, an alkylcarbonyl group, a sulfo group, and a hydroxyl group.

Examples of such a hydrogen-bonding group include a hydrogen bond-donating group and a hydrogen bond-accepting group.

Specific examples of the hydrogen bond-donating group include an amino group, an amide group, a urea group, a urethane group, a sulfonylamino group, a sulfo group, a phospho group, a hydroxy group, a mercapto group, a carboxyl group, a methylene group substituted with an electron withdrawing group, and a methine group substituted with electron withdrawing group. Among these, a carboxyl group or an amide group is preferable.

Specific examples of the hydrogen bond-accepting group include a heteroatom having an unshared electron pair on a heterocycle, a hydroxy group, an aldehyde, a ketone, a carboxyl group, carboxylic acid ester, carboxylic acid amide, a lactone, a lactam, sulfonic acid amide, a sulfo group, a phospho group, phosphoric acid amide, urethane, urea, an ether structure (particularly, a polymer structure having an oxygen atom contained in a polyether structure), an aliphatic amine, and an aromatic amine. Among these, a carboxyl group and an amide group are preferable.

(Repeating Structure B2)

The repeating structure B2 of the fluorine-containing polymer is a repeating structure having a fluorine atom.

In the present invention, from the viewpoint of further increasing the alignment degree of the polarizer layer to be formed, the content of the repeating structure B2 is preferably in a range of 15% to 90% by mass, more preferably in a range of 20% to 80% by mass, and still more preferably in a range of 30% to 70% by mass with respect to the total mass of the surfactant.

Further, the surfactant may have only one or two or more kinds of repeating structures B2. In a case where the surfactant has two or more kinds of repeating structures B2, the content of the repeating structures B2 is the total content of the repeating structure B2.

(Repeating Structure B3)

In the present invention, from the viewpoint of enhancing the upper layer coating properties with respect to the polarizer layer to be formed, it is preferable that the fluorine-containing polymer has a repeating structure B3 to be derived from a monomer having a molecular weight of 300 or less in addition to the repeating structures B1 and B2 described above.

From the viewpoint of further enhancing the upper layer coating properties with respect to the polarizer layer to be formed, a repeating structure represented by Formula (N-1) is preferable as the repeating structure B3. It is preferable that the repeating structure B3 has a structure different from the repeating structure B2 described above and does not have a fluorine atom.

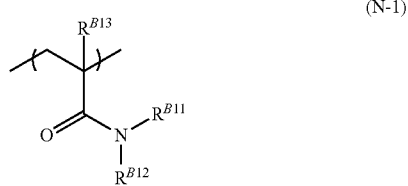

In Formula (N-1), $R^{B11}$ and $R^{B12}$ each independently represent a hydrogen atom or a substituent. However, in a case where $R^{B11}$ and $R^{B12}$ represent a substituent, $R^{B11}$ and $R^{B12}$ may be linked to each other to form a ring.

The total molecular weight of $R^{B11}$ and $R^{B12}$ is preferably 200 or less, more preferably 100 or less, and still more preferably 70 or less. In a case where the total molecular weight thereof is 100 or less, the interaction between the repeating structures B3 is further improved, and the compatibility between the surfactant and the liquid crystal molecule can be further decreased. In this manner, a polarizer layer having less alignment defects and an excellent alignment degree can be obtained.

The lower limit of the total molecular weight of $R^{B11}$ and $R^{B12}$ is preferably 2 or greater.

From the viewpoint that the effects of the present invention are more excellent, as the substituent represented by $R^{B11}$ and $R^{B12}$, an organic group is preferable, an organic group having 1 to 15 carbon atoms is more preferable, an organic group having 1 to 12 carbon atoms is still more preferable, and an organic group having 1 to 8 carbon atoms is particularly preferable.

Examples of the organic group include a linear, branched or cyclic alkyl group, an aromatic hydrocarbon group, and a heterocyclic group.

The number of carbon atoms of the alkyl group is preferably in a range of 1 to 15, more preferably in a range of 1 to 12, and still more preferably in a range of 1 to 8.

The number of carbon atoms of the alkyl group is preferably in a range of 1 to 15, more preferably in a range of 1 to 12, and still more preferably in a range of 1 to 8.

The carbon atoms of the alkyl group may be substituted with —O—, —Si(CH$_3$)$_2$—, —(Si(CH$_3$)$_2$O)$_g$—, —(OSi (CH$_3$)$_2$)$_g$— (g represents an integer of 1 to 10), —N(Z)—, —C(Z)=C(Z')—, —C(Z)=N—, —N=C(Z)—, —C(O)—, —OC(O)—, —C(O)O—, —O—C(O)O—, —N(Z)C(O)—, —C(O)N(Z)—, —C(Z)=C(Z')—C(O) O—, —O—C(O)—C(Z)=C(Z')—, —C(Z)=N—, —N=C (Z)—, —C(Z)=C(Z')—C(O)N(Z")—, —N(Z")—C(O)—C (Z)=C(Z')—, —C(Z)=C(Z')—C(O)—S—, —S—C(O)— C(Z)=C(Z')—, —C(Z)=N—N=C(Z')— (Z, Z', and Z" each independently represent a hydrogen atom, an alkyl group having 1 to 4 carbon atoms, a cycloalkyl group, an aryl group, a cyano group, or a halogen atom), —C≡C—, —N=N—, —S—, —C(S)—, —S(O)—, —SO$_2$—, —(O) S(O)O—, —O(O)S(O)O—, —SC(O)—, —C(O)S—, or a group obtained by combining two or more of these groups. Among the groups which may be substituted with the carbon atoms of the alkyl group, from the viewpoint that the effects of the present invention are more excellent, —O—, —C(O)—, —N(Z)—, —OC(O)—, or —C(O)O— is preferable.

Further, the hydrogen atoms of the alkyl group may be substituted with a halogen atom, a cyano group, an aryl group, a nitro group, —OZ$^H$, —C(O)Z$^H$, —C(O)OZ$^H$, —OC(O)Z$^H$, —OC(O)OZ$^H$—NZ$^H$Z$^{Hi}$, —NZ$^H$C(O)Z$^{Hi}$, —NZ$^H$C(O)OZ$^{Hi}$, —C(O)NZ$^H$Z$^{Hi}$, —OC(O)NZ$^H$Z$^{Hi}$, —NZ$^H$C(O)NZ$^{Hi}$OZ$^{Hiii}$, —SZ$^H$, —C(S)Z$^H$, —C(O)SZ$^H$, or —SC(O)Z$^H$. Z$^H$, Z$^{Hi}$, and Z$^{Hiii}$ each independently represent a hydrogen atom, a halogen atom, an alkyl group having 1 to 10 carbon atoms, a cyano group, or a nitro group. Among the groups which may be substituted with the hydrogen atoms of the alkyl group, from the viewpoint that the effects of the present invention are more excellent, —OH, —COOH, or an aryl group (preferably a phenyl group) is preferable.

Further, the hydrogen atoms of the aromatic hydrocarbon group and the hydrogen atoms of the heterocyclic group may be substituted with a halogen atom, a cyano group, an alkyl group having 1 to 10 carbon atoms, a nitro group, —OZ$^H$, —C(O)Z$^H$, —C(O)OZ$^H$, —OC(O)Z$^H$, —OC(O)OZ$^H$— NZ$^H$Z$^{Hi}$, —NZ$^H$C(O)Z$^{Hi}$, —NZ$^H$C(O)OZ$^{Hi}$, —C(O) NZ$^H$Z$^{Hi}$, —OC(O)NZ$^H$Z$^{Hi}$, —NZ$^H$C(O)NZ$^{Hi}$OZ$^{Hiii}$, —SZ$^H$, —C(S)Z$^H$, —C(O)SZ$^H$, —SC(O)Z$^H$, or —B(OH)$_2$. Z$^H$, Z$^{Hi}$, and Z$^{Hiii}$ each independently represent a hydrogen atom, a halogen atom, an alkyl group having 1 to 10 carbon atoms, a cyano group, or a nitro group. Among the groups which may be substituted with the hydrogen atoms of the aromatic hydrocarbon group and the hydrogen atoms of the heterocyclic group, from the viewpoint that the effects of the present invention are more excellent, —OH and —B(OH)$_2$ are preferable.

From the viewpoint that the effects of the present invention are more excellent, it is preferable that $R^{B11}$ and $R^{B12}$ each independently represent a hydrogen atom or an organic group having 1 to 15 carbon atoms. Preferred embodiments of the organic group are as described above.

From the viewpoint that the effects of the present invention are more excellent, at least one of $R^{B11}$ or $R^{B12}$ represents preferably a substituent and more preferably an organic group having 1 to 15 carbon atoms.

The ring formed by $R^{B11}$ and $R^{B12}$ being linked to each other is a heterocyclic ring having a nitrogen atom in Formula (N-1), and may further have heteroatoms such as an oxygen atom, a sulfur atom, and a nitrogen atom in the ring.

From the viewpoint that the effects of the present invention are more excellent, the ring formed by $R^{B11}$ and $R^{B12}$ being linked to each other is preferably a 4- to 8-membered ring, more preferably a 5- to 7-membered ring, and still more preferably a 5- or 6-membered ring.

From the viewpoint that the effects of the present invention are more excellent, the number of carbon atoms constituting the ring formed by $R^{B11}$ and $R^{B12}$ being linked to each other is preferably in a range of 3 to 7 and more preferably in a range of 3 to 6.

The ring formed by $R^{B11}$ and $R^{B12}$ being linked to each other may or may not have aromaticity, but it is preferable that the ring does not have aromaticity from the viewpoint that the effects of the present invention are more excellent.

Specific examples of the ring formed by $R^{B11}$ and $R^{B12}$ being linked to each other include the following groups.

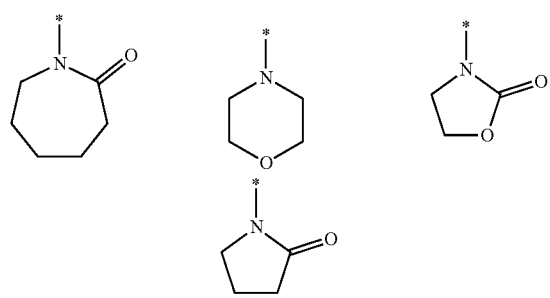

$R^{B13}$ represents a hydrogen atom, an alkyl group having 1 to 5 carbon atoms, a halogen atom, or a cyano group, preferably a hydrogen atom or an alkyl group having 1 to 5 carbon atoms, and more preferably a hydrogen atom.

The number of carbon atoms in the alkyl group is in a range of 1 to 5, preferably in a range of 1 to 3, and more preferably 1. The alkyl group may have a linear, branched, or cyclic structure.

Specific examples of the repeating structure B3 are shown below, but the repeating structure B3 is not limited to the following structures.

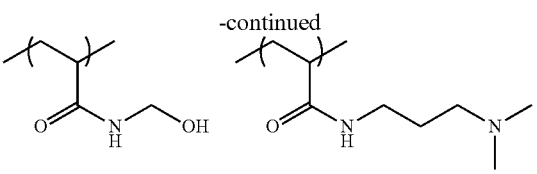
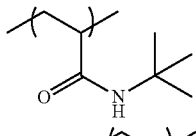
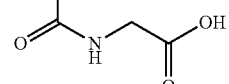
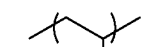
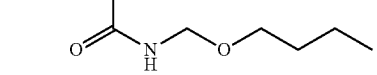
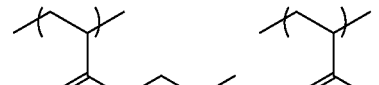
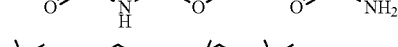
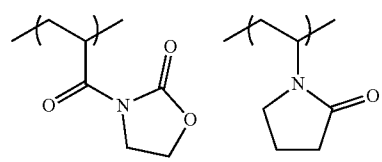
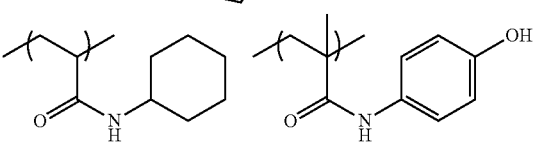
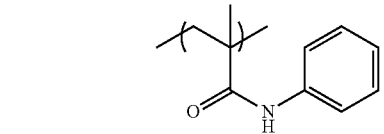
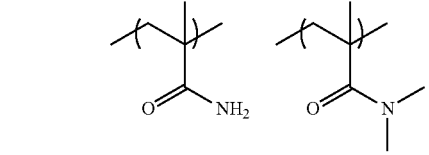
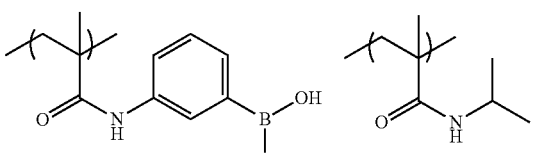
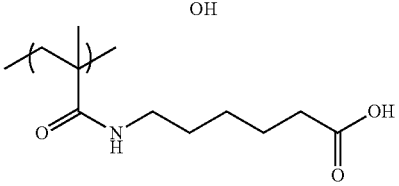

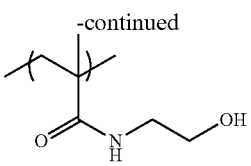

The content of the repeating structure B3 is preferably in a range of 3% to 75% by mass, more preferably in a range of 1500 to 70% by mass, and still more preferably in a range of 200% to 65% by mass with respect to the total mass of all repeating structures of the fluorine-containing polymer. In a case where the content of the repeating structure B3 is in the above-described ranges, the effects of the present invention are more excellent.

The surfactant may have only one or two or more kinds of repeating structures B3. In a case where the surfactant has two or more kinds of repeating structures B3, the above-described content of the repeating structure B3 denotes the total content of the repeating structures B3.

(Other Repeating Structures (No. 1))

The fluorine-containing polymer may further have a repeating structure represented by General Formula (M-3).

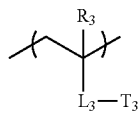

(M-3)

In Formula (M-3), $R^3$ represents a hydrogen atom, a fluorine atom, a chlorine atom, or an alkyl group having 1 to 20 carbon atoms, L3 represents a single bond or a divalent linking group, and T3 represents an aromatic ring.

Examples of the linking group as L3 include the same groups as those for SP21 in Formula (F-2).

Examples of the aromatic ring group as T3 include an aromatic hydrocarbon ring group such as a benzene ring group, a naphthalene ring group, an anthracene ring group, or a phenanthroline ring group, and an aromatic heterocyclic group such as a furan ring group, a pyrrole ring group, a thiophene ring group, a pyridine ring group, a thiazole ring group, or a benzothiazole ring group. Among these, a benzene ring group (for example, a 1,4-phenyl group) is preferable. The compatibility can be improved by allowing the polymer to contain these groups.

Specific examples of the monomer forming the repeating structure represented by Formula (M-3) include structures represented by Formulae (M3-1) to (M3-5), but the present invention is not limited thereto.

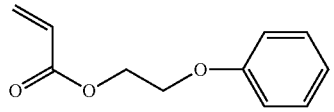

(M3-1)

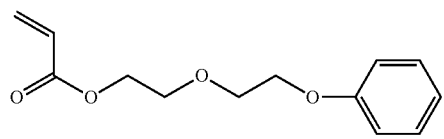

(M3-2)

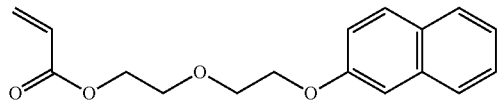

(M3-3)

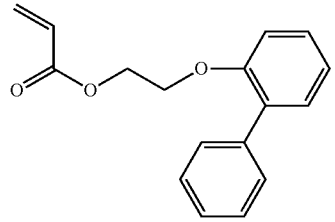

(M3-4)

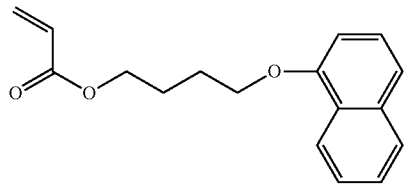

(M3-5)

(Other Repeating Structures (No. 2))

The fluorine-containing polymer may further have a repeating structure represented by General Formula (M-4).

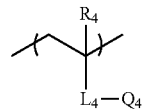

(M-4)

In Formula (M-4), R4 represents a hydrogen atom, a fluorine atom, a chlorine atom, or an alkyl group having 1 to 20 carbon atoms, L4 represents a single bond or a divalent linking group, and Q4 represents a crosslinkable group represented by any of Formulae (P1) to (P30).

Examples of the linking group as L4 include the same groups as those for SPW in Formula (W1), such as an aromatic hydrocarbon group having 4 to 20 carbon atoms, a cyclic alkylene group having 4 to 20 carbon atoms, and a heterocyclic group having 1 to 20 carbon atoms. Among these, a linear, branched, or cyclic alkylene group having 1 to 20 carbon atoms, and an aromatic hydrocarbon group having 4 to 20 carbon atoms are preferable, and it is preferable that the linking group contains —O—, —CO—O—, —CO—NH—, and —O—CO—.

In a case where Q4 represents a group containing a cationically polymerizable group, the cationically polymerizable group is not particularly limited, and examples thereof include an alicyclic ether group, a cyclic acetal group, a cyclic lactone group, a cyclic thioether group, a spiroorthoester group, and a vinyloxy group.

As the cationically polymerizable group, an alicyclic ether group or a vinyloxy group is preferable, an epoxy group, an oxetanyl group, or a vinyloxy group is more preferable, an epoxy group or an oxetanyl group is still more preferable, and an epoxy group is particularly preferable. An alicyclic epoxy group is particularly preferable as the epoxy group. Further, each of the above-described groups may have a substituent.

In a case where Q4 represents a group containing a radically polymerizable group, the radically polymerizable group is not particularly limited, and examples thereof include a group having a polymerizable carbon-carbon double bond, and specific examples thereof include a (meth) acryloyl group, a (meth)acryloyloxy group, a (meth)acrylamide group, a vinyl group, a styryl group, and an allyl group. Among these, a (meth)acryloyloxy group is preferable. Further, each of the above-described groups may have a substituent. The adhesiveness between layers in the form in which a plurality of polarizer layers are laminated can be improved by allowing the polymer to contain the above-described groups.

Specific examples of the monomer forming a repeating structure represented by Formula (M-4) include monomers represented by Formulae (M4-1) to (M4-17), but the present invention is not limited thereto.

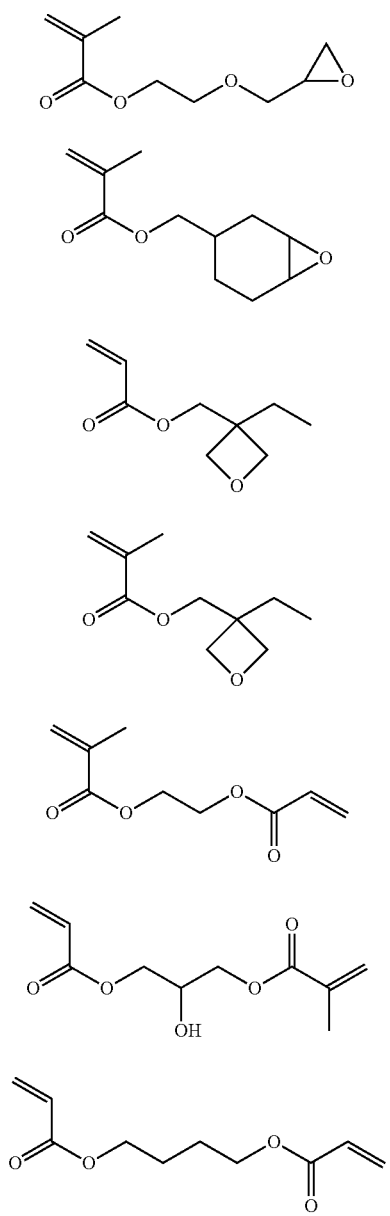

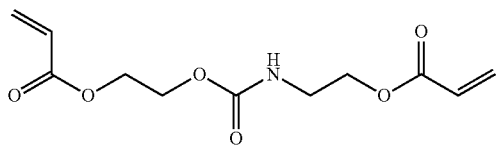

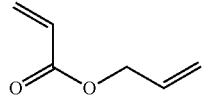

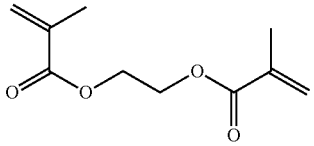

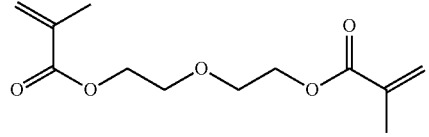

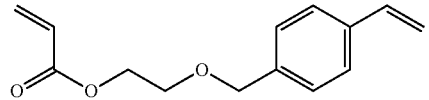

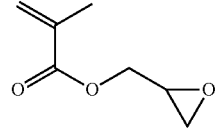

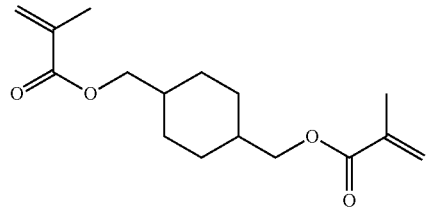

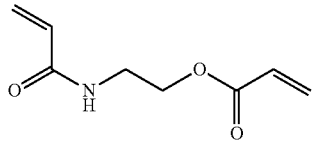

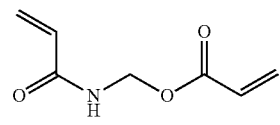

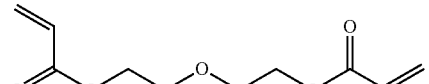

The fluorine-containing polymer may be a polymer having a block structure, a graft structure, a branch structure, or a star structure. It is preferable that the fluorine-containing polymer has such a block structure, a graft structure, a branch structure, or a star structure from the viewpoint that fluorine atomic groups are present lumps and the transferability of the polymer to the coating film surface is improved.

Further, in a copolymer having a random structure with a fluorine-substituted alkyl chain length of 1 to 4, the lumps of fluorine atomic groups are small and the solubility in a general-purpose solvent is excellent, but the transferability to a coating film surface is degraded. Since the fluorine atomic groups are present as lumps, the transferability of the polymer to the coating film surface is high even in a case where the fluorine-substituted alkyl chain length is in a range of 1 to 4, and thus it is preferable that such a copolymer is added to the composition from the viewpoint of reducing the surface tension of the coating film and enhancing the wettability (homogeneous coating property) of the composition to the base material during coating and the surface state of the coating film surface.

In the present invention, in a case where the composition for forming a polarizer contains a surfactant, a difference between the log P value of the surfactant and the log P value of the liquid crystal compound is preferably less than 3.1, more preferably less than 1.4, and still more preferably 0 or greater and less than 1.4 from the viewpoint of further enhancing the display performance and the durability of the image display device.

Here, in a case where a plurality of surfactants or a plurality of liquid crystal compounds are used, the difference (absolute value) between the log P value of the surfactant and the log P value of the liquid crystal compound denotes the minimum difference from among differences calculated from the log P values of the respective compounds.

In a case where the composition for forming a polarizer layer contains a surfactant, the content of the surfactant is preferably in a range of 0.001 to 5 parts by mass and more preferably in a range of 0.01 to 3 parts by mass with respect to 100 parts by mass of the total amount of the azo coloring agent, the dichroic substance other than the azo coloring agent, and the liquid crystal compound in the composition for forming a polarizer layer.

The surfactant may be used alone or in combination of two or more kinds thereof. In a case where the composition contains two or more kinds of surfactants, it is preferable that the total amount of the surfactants is in the above-described ranges.

<Adhesion Improver>

The composition for forming a polarizer layer may contain an adhesion improver from the viewpoint of the adhesiveness to a barrier layer described below. Examples of the adhesion improver include a compound containing a hydroxyl group, a carboxyl group, and a boronic acid group, and a compound containing a boronic acid group is preferable.

Suitable examples of the compound containing a boronic acid group include a compound represented by the following formula.

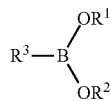

In the formula, $R^1$ and $R^2$ each independently represent a hydrogen atom, a substituted or unsubstituted aliphatic hydrocarbon group, an aryl group, or a heterocyclic group. $R^3$ represents a substituent containing a functional group that can be bonded to a (meth)acrylic group.

<Solvent>

From the viewpoints of the workability and the like, it is preferable that the composition for forming a polarizer layer contains a solvent.

Examples of the solvent include organic solvents such as ketones (such as acetone, 2-butanone, methyl isobutyl ketone, cyclopentanone, and cyclohexanone), ethers (such as dioxane, tetrahydrofuran, 2-methyltetrahydrofuran, cyclopentyl methyl ether, tertrahydropyran, and dioxolanes), aliphatic hydrocarbons (such as hexane), alicyclic hydrocarbons (such as cyclohexane), aromatic hydrocarbons (such as benzene, toluene, xylene, and trimethylbenzene), halogenated carbons (such as dichloromethane, trichloromethane, dichloroethane, dichlorobenzene, and chlorotoluene), esters (such as methyl acetate, ethyl acetate, butyl acetate, and ethyl lactate), alcohols (such as ethanol, isopropanol, butanol, cyclohexanol, isopentyl alcohol, neopentyl alcohol, diacetone alcohol, and benzyl alcohol), cellosolves (such as methyl cellosolve, ethyl cellosolve, and 1,2-dimethoxyethane), cellosolve acetates, sulfoxides (such as dimethyl sulfoxide), amides (such as dimethylformamide, dimethylacetamide, N-methylpyrrolidone, and N-ethylpyrrolidone), and heterocyclic compounds (such as pyridine), and water. These solvents may be used alone or in combination of two or more kinds thereof.

Among these solvents, from the viewpoint of exhibiting the effect of the excellent solubility of the composition for forming a polarizer layer, ketones (particularly cyclopentanone and cyclohexanone), ethers (particularly tetrahydrofuran, cyclopentyl methyl ether, tetrahydropyran, and dioxolan), and amides (particularly dimethylformamide, dimethylacetamide, N-methylpyrrolidone, and N-ethylpyrrolidone) are preferable.

In a case where the composition for forming a polarizer layer contains a solvent, the content of the solvent is preferably in a range of 80% to 99% by mass, more preferably in a range of 83% to 97% by mass, and particularly preferably in a range of 85% to 95% by mass with respect to the total mass of the composition for forming a polarizer layer.

These solvents may be used alone or in combination of two or more kinds thereof. In a case where the composition contains two or more kinds of solvents, it is preferable that the total amount of the solvents is in the above-described range.

<Method of Producing Polarizer Layer>

The method of producing the polarizer layer is not particularly limited, but a method including a step of coating an alignment film with the above-described present composition to form a coating film (hereinafter, also referred to as "coating film forming step") and a step of aligning an azo coloring agent and a dichroic substance other than the azo coloring agent contained in the coating film (hereinafter, also referred to as "aligning step") in this order (hereinafter, also referred to as the "present production method") is preferable from the viewpoint of further increasing the alignment degree of the polarizer layer to be obtained.

Hereinafter, each step will be described.

(Coating Film Forming Step)

The coating film forming step is a step of coating the alignment film with the above-described composition for forming a polarizer layer to form a coating film. The liquid crystal compound in the coating film is horizontally aligned due to an interaction between the alignment film and an interface improver (in a case where the present composition contains an interface improver).

The alignment film can be easily coated with the present composition of the present invention by using the composition of the present invention which contains the above-described solvent or using a liquid such as a melt obtained by heating the composition of the present invention.

Examples of a method of applying the present composition include known methods such as a roll coating method, a gravure printing method, a spin coating method, a wire bar coating method, an extrusion coating method, a direct gravure coating method, a reverse gravure coating method, a die coating method, a spraying method, and an ink jet method.

(Alignment Film)

The alignment film used in the coating film forming step will be described.

An alignment film may be any film as long as the film allows the liquid crystal compound contained in the present composition to be horizontally aligned.

An alignment film can be provided by means such as a rubbing treatment performed on a film surface of an organic compound (preferably a polymer), oblique vapor deposition of an inorganic compound, formation of a layer having microgrooves, or accumulation of an organic compound (such as ω-tricosanoic acid, dioctadecylmethylammonium chloride, or methyl stearylate) according to a Langmuir-Blodgett method (LB film). Further, an alignment film in which an alignment function is generated by application of an electric field, application of a magnetic field, or irradiation with light is also known. Among these, in the present invention, an alignment film formed by performing a rubbing treatment is preferable from the viewpoint of easily controlling the pretilt angle of the alignment film, and a photo-alignment film formed by irradiation with light is also preferable from the viewpoint of the uniformity of alignment.

(1) Rubbing Treatment Alignment Film

A polymer material used for the alignment film formed by performing a rubbing treatment is described in multiple documents, and a plurality of commercially available products can be used. In the present invention, polyvinyl alcohol or polyimide and derivatives thereof are preferably used. The alignment film can refer to the description on page 43, line 24 to page 49, line 8 of WO2001/88574A1. The thickness of the alignment film is preferably in a range of 0.01 to 10 μm and more preferably in a range of 0.01 to 2 μm.

(2) Photo-Alignment Film

A photo-alignment material used for an alignment film formed by irradiation with light is described in a plurality of documents. In the present invention, preferred examples thereof include azo compounds described in JP2006-285197A, JP2007-76839A, JP2007-138138A, JP2007-94071A, JP2007-121721A, JP2007-140465A, JP2007-156439A, JP2007-133184A, JP2009-109831A, JP3883848B, and JP4151746B, aromatic ester compounds described in JP2002-229039A, maleimide and/or alkenyl-substituted nadiimide compounds having a photo-alignment unit described in JP2002-265541A and JP2002-317013A, photocrosslinkable silane derivatives described in JP4205195B and JP4205198B, and photocrosslinkable polyimides, polyamides, or esters described in JP2003-520878A, JP2004-529220A, and JP4162850B. Among these, azo compounds, photocrosslinkable polyimides, polyamides, or esters are more preferable.

Among these, a photosensitive compound containing a photoreactive group that is generated by at least one of dimerization or isomerization due to the action of light is preferably used as the photo-alignment compound.

Examples of the photoreactive group include a group having a cinnamic acid (cinnamoyl) structure (skeleton), a group having a coumarin structure (skeleton), a group having a chalcone structure (skeleton), a group having a benzophenone structure (skeleton), and a group having an anthracene structure (skeleton). Among these groups, a group having a cinnamoyl structure or a group having a coumarin structure is preferable, and a group having a cinnamoyl structure is more preferable.

In addition, the photosensitive compound containing a photoreactive group may further contain a crosslinkable group.

As the crosslinkable group, a thermally crosslinkable group that causes a curing reaction due to the action of heat and a photocrosslinkable group that causes a curing reaction due to the action of light are preferable, and the crosslinkable group may be a crosslinkable group that contains both a thermally crosslinkable group and a photocrosslinkable group.

Examples of the crosslinkable group include at least one selected from the group consisting of an epoxy group, an oxetanyl group, a group represented by —NH—$CH_2$—O—R (R represents a hydrogen atom or an alkyl group having 1 to 20 carbon atoms), a group having an ethylenically unsaturated double bond, and a block isocyanate group. Among these, an epoxy group, an oxetanyl group, or a group having an ethylenically unsaturated double bond is preferable.

Further, a 3-membered cyclic ether group is also referred to as an epoxy group, and a 4-membered cyclic ether group is also referred to as an oxetanyl group.

Further, specific examples of the group having an ethylenically unsaturated double bond include a vinyl group, an allyl group, a styryl group, an acryloyl group, and a methacryloyl group. Among these, an acryloyl group or a methacryloyl group is preferable.

The photo-alignment film formed of the above-described material is irradiated with linearly polarized light or non-polarized light to produce a photo-alignment film.

In the present specification, the "irradiation with linearly polarized light" and the "irradiation with non-polarized light" are operations for causing a photoreaction in the photo-alignment material. The wavelength of the light to be used varies depending on the photo-alignment material to be used and is not particularly limited as long as the wavelength is required for the photoreaction. The peak wavelength of light to be used for irradiation with light is preferably in a range of 200 nm to 700 nm, and ultraviolet light having a peak wavelength of 400 nm or less is more preferable.

Examples of the light source used for irradiation with light include commonly used light sources, for example, lamps such as a tungsten lamp, a halogen lamp, a xenon lamp, a xenon flash lamp, a mercury lamp, a mercury xenon lamp, and a carbon arc lamp, various lasers [such as a semiconductor laser, a helium neon laser, an argon ion laser, a helium cadmium laser, and a yttrium aluminum garnet (YAG) laser], a light emitting diode, and a cathode ray tube.

As means for obtaining linearly polarized light, a method of using a polarizing plate (for example, an iodine polarizing plate, a dichroic substance polarizing plate, or a wire grid polarizing plate), a method of using a prism-based element (for example, a Glan-Thompson prism) or a reflective type polarizer for which a Brewster's angle is used, or a method of using light emitted from a laser light source having polarized light can be employed. In addition, only light having a required wavelength may be selectively applied using a filter or a wavelength conversion element.

In a case where light to be applied is linearly polarized light, a method of applying light vertically or obliquely to the upper surface with respect to the alignment film or the surface of the alignment film from the rear surface is employed. The incidence angle of light varies depending on the photo-alignment material, but is preferably in a range of 0 to 90° (vertical) and preferably in a range of 40 to 90°.

In a case where light to be applied is non-polarized light, the alignment film is irradiated with non-polarized light obliquely. The incidence angle is preferably in a range of 10° to 80°, more preferably in a range of 20° to 60°, and still more preferably in a range of 30° to 50°.

The irradiation time is preferably in a range of 1 minute to 60 minutes and more preferably in a range of 1 minute to 10 minutes.

In a case where patterning is required, a method of performing irradiation with light using a photomask as many times as necessary for pattern preparation or a method of writing a pattern by laser light scanning can be employed.

The alignment film may be formed on any base material, or the base material itself may also serve as an alignment film. The base material of the alignment film can be appropriately selected, and examples thereof include glass and a polymer film. The light transmittance of the base material is preferably 80% or greater.

In a case where a polymer film is used as the base material, it is preferable to use an optically isotropic polymer film. As specific examples and preferred embodiments of the polymer, the description in paragraph [0013] of JP2002-22942A can be applied. Further, even in a case of a polymer easily exhibiting the birefringence such as polycarbonate and polysulfone which has been known in the related art, a polymer with the exhibiting property which has been decreased by modifying the molecules described in WO2000/26705A can be used.

The alignment film and the base material of the alignment film may or may not be left after being removed from the laminate. Examples of a method of not leaving the alignment film and the base material of the alignment film in the laminate include a method forming a polarizer layer on the alignment film, bonding the surface of the polarizer layer to the material constituting the laminate, for example, the substrate, and peeling off the base material of the alignment film. Here, only the base material of the alignment film may be removed so that only the alignment film remains in the laminate.

(Aligning Step)

The aligning step is a step of aligning the liquid crystal component contained in the coating film. In this manner, the polarizer layer of the present invention is obtained.

The aligning step may include a drying treatment. Components such as a solvent can be removed from the coating film by performing the drying treatment. The drying treatment may be performed according to a method of allowing the coating film to stand at room temperature for a predetermined time (for example, natural drying) or a method of heating the coating film and/or blowing air to the coating film.

Here, the liquid crystal component contained in the composition for forming a polarizer layer may be aligned by the coating film forming step or the drying treatment described above. For example, in an aspect in which the composition for forming a polarizer layer is prepared as a coating solution containing a solvent, the polarizer layer is obtained by drying the coating film and removing the solvent from the coating film.

In a case where the drying treatment is performed at a temperature higher than or equal to the transition temperature of the liquid crystal component contained in the coating film to the liquid crystal phase, the heat treatment described below may not be performed.

The transition temperature of the liquid crystal component contained in the coating film to the liquid crystal phase is preferably in a range of 10° C. to 250° C. and more preferably in a range of 25° C. to 190° C. from the viewpoint of the manufacturing suitability or the like. It is preferable that the transition temperature is 10° C. or higher from the viewpoint that a cooling treatment or the like for lowering the temperature to a temperature range in which a liquid crystal phase is exhibited is not necessary. Further, it is preferable that the transition temperature is 250° C. or lower from the viewpoint that a high temperature is not required even in a case of setting an isotropic liquid state at a temperature higher than the temperature range in which a liquid crystal phase is temporarily exhibited, and waste of thermal energy and deformation and deterioration of a substrate can be reduced.

It is preferable that the aligning step includes a heat treatment. In this manner, since the liquid crystal component contained in the coating film can be aligned, the coating film after being subjected to the heat treatment can be suitably used as the polarizer layer.

From the viewpoint of the manufacturing suitability, the heat treatment is performed at a temperature of preferably 10° C. to 250° C. and more preferably 25° C. to 190° C. Further, the heating time is preferably in a range of 1 to 300 seconds and more preferably in a range of 1 to 60 seconds.

The aligning step may include a cooling treatment performed after the heat treatment. The cooling treatment is a treatment of cooling the coating film after being heated to room temperature (20° C. to 25° C.). In this manner, the alignment of the liquid crystal component contained in the coating film can be fixed. The cooling means is not particularly limited and can be performed according to a known method.

The polarizer layer can be obtained by performing the above-described steps.

In the present aspect, examples of the method of aligning the liquid crystal components contained in the coating films include a drying treatment and a heat treatment, but the method is not limited thereto, and the liquid crystal components can be aligned by a known alignment treatment.

(Other Steps)

The method of producing the polarizer layer may include a step of curing the polarizer layer after the aligning step (hereinafter, also referred to as a "curing step").

The curing step is performed by heating the polarizer layer and/or irradiating the layer with light (exposing the layer to light), for example, in a case where the polarizer layer contains a crosslinkable group (polymerizable group). Between these, it is preferable that the curing step is performed by irradiating the layer with light.

Various light sources such as infrared rays, visible light, and ultraviolet rays can be used as the light source for curing, but ultraviolet rays are preferable. In addition, ultraviolet rays may be applied while the layer is heated during curing, or ultraviolet rays may be applied through a filter that transmits only a specific wavelength.

In a case where the exposure is performed while the layer is heated, the heating temperature during the exposure depends on the transition temperature of the liquid crystal component contained in the polarizer layer to the liquid crystal phase, but is preferably in a range of 25° to 140° C.

Further, the exposure may be performed under a nitrogen atmosphere. In a case where the curing of the polarizer layer proceeds by radical polymerization, since the inhibition of polymerization by oxygen is reduced, it is preferable that exposure is performed in a nitrogen atmosphere.

[Optically Anisotropic Film]

It is preferable that the laminate according to the embodiment of the present invention includes an optically anisotropic film.

Here, the optically anisotropic film denotes all films showing a phase difference, and examples thereof include a stretched polymer film and a phase difference film provided with an optically anisotropic layer containing a liquid crystal compound aligned on a support.

Here, the alignment direction of the liquid crystal compound contained in the optically anisotropic layer is not particularly limited, and examples thereof include horizontal, vertical, and twisted alignment with respect to the film surface.

Further, a $\lambda/4$ plate, a $\lambda/2$ plate, and the like have specific functions of the optically anisotropic film.

In addition, the optically anisotropic layer may be formed of a plurality of layers. In regard to the optically anisotropic layer formed of a plurality of optically anisotropic layers, for example, the description in paragraphs [0008] to [0053] of JP2014-209219A can be referred to.

Further, such an optically anisotropic film and the above-described polarizer layer may be provided by coming into contact with each other, or another layer may be provided between the optically anisotropic film and the polarizer layer. Examples of such a layer include a pressure sensitive adhesive layer or an adhesive layer for ensuring the adhesiveness.

The laminate according to the embodiment of the present invention includes preferably a $\lambda/4$ plate as the optically anisotropic film described above and more preferably a $\lambda/4$ plate on the polarizer layer.

Here, "$\lambda/4$ plate" is a plate having a $\lambda/4$ function, specifically, a plate having a function of converting linearly polarized light having a specific wavelength into circularly polarized light (or converting circularly polarized light into linearly polarized light).

For example, specific examples of an aspect in which a $\lambda/4$ plate has a single-layer structure include a stretched polymer film and a phase difference film in which an optically anisotropic layer having a $\lambda/4$ function is provided on a support. Further, specific examples of an aspect in which a $\lambda/4$ plate has a multilayer structure include a broadband $\lambda/4$ plate obtained by laminating a $\lambda/4$ plate and a $\lambda/2$ plate.

[Barrier Layer]

The laminate according to the embodiment of the present invention may include a barrier layer on the polarizer layer.

Here, the barrier layer is also referred to as a gas barrier layer (oxygen blocking layer) and has a function of protecting the polarizer of the present invention from gas such as oxygen in the atmosphere, the moisture, or the compound contained in an adjacent layer.

In regard to the barrier layer, for example, the description in paragraphs [0014] to [0054] of JP2014-159124A, paragraphs [0042] to [0075] of JP2017-121721A, paragraphs [0045] to [0054] of JP2017-115076A, paragraphs [0010] to [0061] of JP2012-213938A, and paragraphs [0021] to [0031] of JP2005-169994A can be referred to.

[Pressure Sensitive Adhesive Layer]

It is preferable that the laminate according to the first aspect of the present invention includes at least one pressure sensitive adhesive layer between the two substrates described above.

Further, the laminate according to the second aspect and the third aspect of the present invention includes at least one pressure sensitive adhesive layer between the two substrates described above.

Such a pressure sensitive adhesive layer is not particularly limited, but can be suitably used, for example, between the base material and the polarizer layer, between the polarizer layer and the optically anisotropic layer, or between the base material and the optically anisotropic layer.

Examples of the pressure sensitive adhesive contained in the pressure sensitive adhesive layer include a rubber-based pressure sensitive adhesive, an acrylic pressure sensitive adhesive, a silicone-based pressure sensitive adhesive, a urethane-based pressure sensitive adhesive, a vinyl alkyl ether-based pressure sensitive adhesive, a polyvinyl alcohol-based pressure sensitive adhesive, a polyvinylpyrrolidone-based pressure sensitive adhesive, a polyacrylamide-based pressure sensitive adhesive, and a cellulose-based pressure sensitive adhesive. From the viewpoints of the transparency, the weather resistance, the heat resistance, and the like, an acrylic pressure sensitive adhesive is preferable. In addition, the materials described in paragraphs [0034] to [0057] of JP2014-152198A can also be preferably used.

The pressure sensitive adhesive layer can be formed by a method of coating a release sheet with a solution of a pressure sensitive adhesive, drying the solution, and transferring the sheet to a surface of a transparent resin layer or a method of directly coating a surface of a transparent resin layer with a solution of a pressure sensitive adhesive and drying the solution.

A solution of a pressure sensitive adhesive is prepared as a 10 to 40 mass % solution obtained by dissolving or dispersing the pressure sensitive adhesive in a solvent such as toluene or ethyl acetate.

As a coating method, a roll coating method such as reverse coating or gravure coating, a spin coating method, a screen coating method, a fountain coating method, a dipping method, or a spraying method can be employed.

Examples of the constituent material of the release sheet include appropriate thin paper bodies, for example, synthetic resin films such as polyethylene, polypropylene, and polyethylene terephthalate, rubber sheets, paper, cloth, nonwoven fabrics, nets, foam sheets, and metal foils.

The laminate according to the embodiment of the present invention may have a plurality of pressure sensitive adhesive layers. The containing components and the thicknesses of the plurality of pressure sensitive adhesive layers may be the same as or different from each other.

In the present invention, it is desirable that the amount of the compound in the pressure sensitive adhesive, which can promote the decomposition reaction of the azo coloring agent, is reduced as much as possible in order to increase the discoloration resistance of the laminate.

Here, examples of the compound capable of promoting the decomposition reaction of the azo coloring agent include water, a reducing agent, a nucleophilic compound, an acid, and a base. It is particularly preferable to suppress the presence of water and a reducing agent against the discoloration of the azo coloring agent.

In particular, from the viewpoint of further enhancing the discoloration resistance, the content of the reducing agent in each at least one pressure sensitive adhesive layer is preferably 0.04 g/m² or less and more preferably 0.03 g/m² or less.

From the same viewpoint as described above, in a case where a plurality of pressure sensitive adhesive layers are provided, the total content of the reducing agent in all the pressure sensitive adhesive layers is preferably 0.04 g/m² or less and more preferably 0.03 g/m² or less.

Since water has nucleophilicity, promotes decomposition of an azo bond, and also has an action of promoting a reaction due to a reducing agent, an acid, or a base, it is desirable to suppress the amount of water to be present.

In the laminate according to the embodiment of the present invention, the content of moisture present between the two substrates is preferably 0.8 g/m² or less, more preferably 0.7 g/m² or less, still more preferably 0.6 g/m² or less, particularly preferably 0.4 g/m² or less, and most preferably 0.3 g/m² or less. In the laminate according to the first aspect of the present invention, the content of moisture present between the two substrates is 0.9 g/m² or less.

Here, the moisture content is measured by a method of measuring a change amount (initial mass-dry mass) between the initial mass of the laminate to be measured and the dry mass of the laminate after being decomposed and dried at 120° C. for 2 hours and converting the results per unit area.

Further, the initial mass is the mass measured immediately after the laminate to be measured is allowed to stand in an environment of a temperature of 25° C. and a relative humidity of 60% for 3 days.

Further, the dry mass after decomposition is the mass measured immediately after any one of the two substrates is peeled off within 30 minutes after the measurement of the initial mass and dried at 120° C. for 2 hours.

Further, from the viewpoint of reducing the content of moisture brought in between two substrates of the laminate and easily adjusting the moisture content to be in the above-described ranges, the moisture content of the pressure sensitive adhesive layer is preferably 0.4% or less and more preferably 0.3% or less.

Here, the moisture content denotes a value measured using a Karl Fischer moisture meter after the pressure sensitive adhesive layer to be measured is allowed to stand in an environment of a temperature of 25° C. and a relative humidity of 60% for 3 days.

Further, in a case where a commercially available pressure sensitive adhesive layer is used for the laminate according to the embodiment of the present invention, the moisture content can be measured in a state where the liner of the commercially available pressure sensitive adhesive layer is peeled off.

In addition, the moisture content of the pressure sensitive adhesive layer can be adjusted by a method of drying the pressure sensitive adhesive layer in an environment with a relative humidity lower than the relative humidity of an environment in which the laminate is prepared, before the preparation of the laminate.

Since the reducing agent can easily decompose the azo bond, it is desirable to suppress the amount of the reducing agent to be present.

Examples of the reducing agent include a phenol-based compound such as p-methoxyphenol, cresol, t-butylcatechol, 3,5-di-t-butyl-4-hydroxytoluene, 2,2'-methylenebis (4-methyl-6-t-butylphenol), 2,2'-methylenebis (4-ethyl-6-t-butylphenol), 4,4'-thiobis(3-methyl-6-t-butylphenol), 4-methoxy-1-naphthol, or 4,4'-dialkoxy-2,2'-bi-1-naphthol; a quinone-based compound such as hydroquinone, methylhydroquinone, tert-butylhydroquinone, p-benzoquinone, methyl-p-benzoquinone, tert-butyl-p-benzoquinone, 2,5-diphenylbenzoquinone, 2-hydroxy-1,4-naphthoquinone, 1,4-naphthoquinone, 2,3-dichloro-1,4-naphthoquinone, anthraquinone, or diphenoquinone; an amine-based compound such as p-phenylenediamine, 4-aminodiphenylamine, N,N'-diphenyl-p-phenylenediamine, N-i-propyl-N'-phenyl-p-phenylenediamine, N-(1,3-dimethylbutyl)-N'-phenyl-p-phenylenediamine, N,N'-di-2-naphthyl-p-phenylenediamine, diphenylamine, N-phenyl-β-naphthylamine, 4,4'-dicumyl-diphenylamine, or 4,4'-dioctyl-diphenylamine; a thioether-based compound such as phenothiazine or distearylthiodipropionate; and a nitroso-based compound such as N-nitrosodiphenylamine, N-nitrosophenylnaphthylamine, N-nitrosodinaphthylamine, p-nitrosophenol, nitrosobenzene, p-nitrosodiphenylamine, α-nitroso-β-naphthol, N,N-dimethyl-p-nitrosoaniline, p-nitrosodiphenylamine, p-nitrosodimethylamine, p-nitroso-N,N-diethylamine, N-nitrosoethanolamine, N-nitroso-di-n-butylamine, N-nitroso-N-n-butyl-4-butanolamine, N-nitroso-diisopropanolamine, N-nitroso-N-ethyl-4-butanolamine, 5-nitroso-8-hydroxyquinoline, N-nitrosomorpholine, N-nitroso-N-phenylhydroxylamine ammonium salt, nitrosobenzene, 2,4,6-tri-tert-butylnitrosobenzene, N-nitroso-N-methyl-p-toluenesulfonamide, N-nitroso-N-ethylurethane, N-nitroso-N-n-propylurethane, 1-nitroso-2-naphthol, 2-nitroso-1-naphthol, sodium 1-nitroso-2-naphthol-3,6-sulfonate, sodium 2-nitroso-1-naphthol-4-sulfonate, 2-nitroso-5-methylaminophenol hydrochloride, or 2-nitroso-5-methylaminophenol hydrochloride.

In addition, hydrazines such as hydrazine, methylhydrazine, 1,1-dimethylhydrazine, and phenylhydrazine, and pyrrolidones such as N-methylpyrrolidone, N-ethylpyrrolidone, and N-vinylpyrrolidone also act as a reducing agent with respect to an azo bond.

The amount of the reducing agent present between the two substrates of the laminate is preferably 0.04 g/m² or less and more preferably 0.03 g/m² or less.

In the laminate according to the first aspect and the third aspect of the present invention, the thickness of the pressure sensitive adhesive layer is not particularly limited, but is preferably in a range of 3 μm to 220 μm.

In the laminate according to the first aspect and the third aspect of the present invention, from the viewpoint that the effects of the present invention are apparent, the thickness of each at least one pressure sensitive adhesive layer is preferably 100 μm or greater, more preferably in a range of 100 to 300 μm, and still more preferably in a range of 100 to 220 μm.

In the laminate according to the first aspect and the third aspect of the present invention, in a case where a plurality of pressure sensitive adhesive layers are provided, the total thickness of the pressure sensitive adhesive layers is preferably in a range of 15 μm to 250 μm, more preferably in a range of 20 μm to 70 μm, and still more preferably in a range of 25 μm to 50 μm.

In the laminate according to the second aspect of the present invention, the thickness of the pressure sensitive adhesive layer (the total thickness in the case where a plurality of pressure sensitive adhesive layers are provided) is 70 μm or less, but is preferably 50 μm or greater from the viewpoint that the effects of the present invention are apparent.

<Layer of Low Moisture Permeability>

The laminate according to the first aspect and the second aspect of the present invention includes preferably at least one layer of low moisture permeability between the two substrates described above and more preferably at least one layer of low moisture permeability between the polarizer layer and the pressure sensitive adhesive layer in order to hinder movement of the moisture to the polarizer layer.

In addition, the laminate according to the third aspect of the present invention includes at least one layer of low moisture permeability between the two substrates described above.

The laminate may include a single layer or a plurality of such layers of low moisture permeability.

In a case where the pressure sensitive adhesive layers are positioned on both sides of the polarizer layer, the layers of low moisture permeability may be present on both sides of the polarizer layer.

Examples of the material of the layer of low moisture permeability include an olefin-based resin, an acrylic resin, and a polyethylene terephthalate-based resin.

The concept of olefin-based resin here includes a chain-like polyolefin-based resin and a cyclic polyolefin-based resin.

These resin films include a film formed by melt extrusion of a raw material resin, a uniaxially stretched film obtained by forming a film and laterally stretching the film, and a biaxially stretched film obtained by forming a film, longitudinally stretching the film, and laterally stretching the film.

Among these, from the viewpoint that the effects of the present invention are more excellent, it is preferable that at least one layer of low moisture permeability contains a cyclic polyolefin-based resin.

The cyclic polyolefin-based resin is obtained by polymerizing, for example, a cyclic olefin monomer such as norbornene and other cyclopentadiene derivatives in the presence of a catalyst.

Examples of the cyclic polyolefin resin include a resin obtained by performing ring-opening metathesis polymerization on norbornene or a derivative thereof as a monomer obtained by a Diels-Alder reaction from cyclopentadiene and olefins or (meth)acrylic acid or esters thereof and subsequently performing hydrogenation; a resin obtained by performing ring-opening metathesis polymerization on tetracyclododecene or a derivative thereof as a monomer obtained by a Diels-Alder reaction from dicyclopentadiene and olefins or (meth)acrylic acid or esters thereof and subsequently performing hydrogenation; a resin obtained by similarly performing ring-opening metathesis copolymerization at least two monomers selected from norbornene, tetracyclododecene, derivatives thereof, and other cyclic olefin monomers and subsequently performing hydrogenation; and a resin obtained by performing addition copolymerization on an aromatic compound containing a chain-like olefin and/or a vinyl group to a cyclic olefin such as norbornene, tetracyclododecene, or a derivative thereof.

A commercially available product of the cyclic polyolefin-based resin can be easily obtained. Examples of the commercially available product thereof include "TOPAS" produced by TOPAS ADVANCED POLYMERS GmbH and sold by Polyplastics Co., Ltd. in Japan, "ARTON (registered trademark)" sold by JSR Corporation, "ZEONOA (registered trademark)" and "ZEONEX (registered trademark)" sold by Zeon Corporation, and "APEL (registered trademark)" sold by Mitsui Chemicals Co., Inc., which are all trade names.

Typical examples of the chain-like polyolefin-based resin include a polyethylene-based resin and a polypropylene-based resin. Among these, a homopolymer of propylene or a copolymer obtained by copolymerizing propylene as a main component and a comonomer that can be copolymerized with the propylene, for example, ethylene at a ratio of 1% to 20% by mass and preferably 3% to 10% by mass is suitably used.

The polypropylene-based resin may contain an alicyclic saturated hydrocarbon resin. The phase difference value is likely to be controlled by allowing the polypropylene-based resin to contain an alicyclic saturated hydrocarbon resin. The content of the alicyclic saturated hydrocarbon resin is set to preferably in a range of 0.1% to 30% by mass and more preferably in a range of 3% to 20% by mass with respect to the content of the polypropylene-based resin.

The acrylic resin is typically a polymer containing 50% by mass or greater of a methyl methacrylate unit. The content of the methyl methacrylate unit is preferably 70% by mass or greater and may be 100% by mass.

Commercially available products of the acrylic resin containing methyl methacrylate as a main component can be easily obtained, and examples thereof include "SUMIPEX (registered trademark)" sold by Sumitomo Chemical Co., Ltd., "ACRYPET (registered trademark)" sold by Mitsubishi Rayon Co., Ltd., "DELPET (registered trademark)" sold by Asahi Kasei Corporation, and "PARAPET (registered trademark)" sold by Kuraray Co., Ltd., and "ACRYVIEW (registered trademark)" sold by Nippon Shokubai Co., Ltd., which are all trade names.

The polyethylene terephthalate-based resin denotes a resin in which 80% by mole or greater of the repeating unit is formed of ethylene terephthalate, and other dicarboxylic acid components or diol components may be copolymerized. Examples of other dicarboxylic acid components include isophthalic acid, 4,4'-dicarboxydiphenyl, 4,4'-dicarboxybenzophenone, bis(4-carboxyphenyl)ethane, adipic acid, sebacic acid, and 1,4-dicarboxycyclohexane. Examples of other diol components include propylene glycol, butanediol, neopentyl glycol, diethylene glycol, cyclohexanediol, an ethylene oxide adduct of bisphenol A, polyethylene glycol, polypropylene glycol, and polytetramethylene glycol.

The above-described other dicarboxylic acid components and diol components can be used in combination of two or more kinds thereof as necessary. In addition, oxycarboxylic acids such as p-hydroxybenzoic acid and p-p-hydroxyethoxybenzoic acid can also be used in combination. Further, as other copolymerization components, a dicarboxylic acid component or a diol component containing a small amount of an amide bond, a urethane bond, an ether bond, a carbonate bond, or the like may be used.

Commercially available products of the polyethylene terephthalate-based resin film can be easily obtained, and examples thereof include "DIAFOIL (registered trademark)", "HOSTAPHAN (registered trademark)", and "FUSION" (registered trademark) sold by Mitsubishi Plastics Inc., "TEIJIN TETRON Film (registered trademark)", "MELINEX (registered trademark)", "MYLAR (registered trademark)", and "TELEFLEX (registered trademark)" sold by Teijin DuPont Films Japan Ltd., "Toyobo Ester Film (registered trademark)", "Toyobo Espet Film (registered trademark)", "COSMOSHINE (registered trademark)", and "CRISPER (registered trademark)" sold by Toyobo Co., Ltd., "LUMIRROR (registered trademark)" sold by Toray Advanced Film Co., Ltd., "EMBLON (registered trademark)" and "EMBLET (registered trademark)" sold by Unitika Ltd., "SKYROLL (registered trademark)" sold by SKC Co., Ltd., "COFIL (registered trademark)" sold by Kogo Co., Ltd., "ZUITSU Polyester Film (registered trademark)" sold by Zuitsu Co., Ltd., and "TAIKO Polyester Film (registered trademark)" sold by Futamura Chemical Co., Ltd., which are all trade names. Among the polyethylene terephthalate-based resin films, a biaxially stretched product is particularly preferably used.

The thickness of the layer of low moisture permeability is preferably in a range of 3 to 110 μm, more preferably in a range of 5 to 80 μm, and particularly preferably in a range of 10 to 55 μm.

The moisture permeability of the layer of low moisture permeability is preferably 20 g/m$^2$·24 hr or less, more preferably 10 g/m$^2$·24 hr or less, and particularly preferably 5 g/m$^2$·24 hr or less.

<Applications>

The laminate according to the embodiment of the present invention can be used as a polarizer (polarizing plate) and specifically, the laminate can be used as, for example, as a linearly polarizing plate or a circularly polarizing plate.

In a case where the laminate according to the embodiment of the present invention does not include an optically anisotropic layer such as the λ/4 plate, the laminate can be used as a linearly polarizing plate.

Meanwhile, in a case where the laminate according to the embodiment of the present invention includes the λ/4 plate, the laminate can be used as a circularly polarizing plate.

<Image Display Device>

An image display device according to the embodiment of the present invention includes the above-described laminate according to the embodiment of the present invention.

The display element used in the image display device according to the embodiment of the present invention is not particularly limited, and examples thereof include a liquid crystal cell, an organic electroluminescence (hereinafter, abbreviated as "EL") display panel, and a plasma display panel.

Among these, a liquid crystal cell or an organic EL display panel is preferable. That is, in the image display device according to the embodiment of the present invention, a liquid crystal display device obtained by using a liquid crystal cell as a display element or an organic EL display device obtained by using an organic EL display panel as a display element is preferable.

[Viewing Angle Control Layer]

The image display device according to the embodiment of the present invention may include a viewing angle control layer.

Here, the viewing angle control layer is a layer that controls the transmittance as viewed in the front direction and an oblique direction of the image display device used for preventing peeping into the display device or switching the viewing angle, and examples thereof include a light control film (manufactured by 3M Company) and a laminate formed of a polarizer layer having an absorption axis in the thickness direction. In regard to the laminate formed of a polarizer layer having an absorption axis in the thickness direction, for example, the description in paragraphs [0006] to [0043] of WO2018/079854A can be referred to.

Further, suitable examples of an aspect of an organic EL display device which is an example of the image display device according to the embodiment of the present invention include an aspect of an image display device including the viewing angle control layer, the polarizer layer, the optional polarizer layer, and an organic EL display panel from the viewing side.

[Liquid Crystal Display Device]

A liquid crystal display device which is an example of the image display device according to the embodiment of the present invention is a liquid crystal display device that includes the above-described laminate according to the embodiment of the present invention (but does not include a λ/4 plate) and a liquid crystal cell.

In the present invention, between the laminates provided on both sides of the liquid crystal cell, it is preferable that the laminate according to the embodiment of the present invention is used as a front-side polarizer and more preferable that the laminate according to the embodiment of the present invention is used as a front-side polarizer and a rear-side polarizer.

Hereinafter, the liquid crystal cell constituting the liquid crystal display device will be described in detail.

[Liquid Crystal Cell]

It is preferable that the liquid crystal cell used for the liquid crystal display device is in a vertical alignment (VA) mode, an optically compensated bend (OCB) mode, an in-plane-switching (IPS) mode, or a twisted nematic (TN) mode, but the present invention is not limited thereto.

In the liquid crystal cell in a TN mode, rod-like liquid crystal molecules (rod-like liquid crystal compound) are substantially horizontally aligned in a case of no voltage application and further twistedly aligned at 60° to 120°. The liquid crystal cell in a TN mode is most frequently used as a color TFT liquid crystal display device and is described in a plurality of documents.

In the liquid crystal cell in a VA mode, rod-like liquid crystal molecules are substantially vertically aligned at the time of no voltage application. The concept of the liquid crystal cell in a VA mode includes (1) liquid crystal cell in a VA mode in a narrow sense where rod-like liquid crystal molecules are aligned substantially vertically in a case of no voltage application and substantially horizontally in a case of voltage application (described in JP1990-176625A (JP-H2-176625A)), (2) liquid crystal cell (in a multi-domain vertical alignment (MVA) mode) (SID97, described in Digest of tech. Papers (proceedings) 28 (1997) 845) in which the VA mode is formed to have multi-domain in order to expand the viewing angle, (3) liquid crystal cell in an axially symmetric aligned microcell (n-ASM) mode in which rod-like liquid crystal molecules are substantially vertically aligned in a case of no voltage application and twistedly multi-domain aligned in a case of voltage application (described in proceedings of Japanese Liquid Crystal Conference, pp. 58 to 59 (1998)), and (4) liquid crystal cell in a SURVIVAL mode (presented at LCD International 98). Further, the liquid crystal cell may be of any of a patterned vertical alignment (PVA) type, a photo-alignment (optical alignment) type, or a polymer-sustained alignment (PSA) type. Details of these modes are described in JP2006-215326A and JP2008-538819A.

In the liquid crystal cell in an IPS mode, rod-like liquid crystal molecules are aligned substantially parallel to the substrate, and the liquid crystal molecules respond planarly through application of an electric field parallel to the substrate surface. In the IPS mode, black display is carried out in a state where no electric field is applied, and absorption axes of a pair of upper and lower polarizing plates are orthogonal to each other. A method of reducing leakage light during black display in an oblique direction and improve the viewing angle using an optical compensation sheet is disclosed in JP1998-54982A (JP-H10-54982A), JP1999-202323A (JP-H11-202323A), JP1997-292522A (JP-H9-292522A), JP1999-133408A (JP-H11-133408A), JP1999-305217A (JP-H11-305217A), and JP1998-307291A (JP-H10-307291A).

[Organic EL Display Device]

Suitable examples of the organic EL display device which is an example of the image display device according to the embodiment of the present invention (hereinafter, also referred to as "organic EL display device of the present invention" in the present paragraph) include an aspect of a display device including the above-described laminate (including a pressure sensitive adhesive layer and a λ/4 plate) according to the embodiment of the present invention and an organic EL display panel in order from the viewing side. In this case, the laminate is formed such that a substrate (viewing side), and an alignment film, a polarizer layer, a transparent resin layer, a pressure sensitive adhesive layer, a λ/4 plate, and a substrate (non-viewing side) which are provided as necessary are arranged in order from the viewing side. Further, the substrate of the laminate on the non-viewing side may also serve as a substrate of the organic EL display device. In a case where the organic EL display device of the present invention includes a substrate on a viewing side, the abrasion resistance and the impact resistance are excellent. In addition, the organic EL display device of the present invention is suitably used as, for example, an in-vehicle display device due to the above-described characteristics.

Further, the organic EL display panel is a display panel formed using an organic EL element having an organic light-emitting layer (organic electroluminescence layer) interposed between electrodes (between a cathode and an anode). The configuration of the organic EL display panel is not particularly limited, and a known configuration is employed.

EXAMPLES

Hereinafter, the present invention will be described in more detail with reference to examples. Materials, used amounts, ratios, treatment contents, treatment procedures, and the like described in the following examples can be appropriately changed without departing from the spirit of the present invention. Therefore, the scope of the present invention should not be limitatively interpreted by the following examples.

Example 1

[Preparation of Transparent Support]
<Preparation of Core Layer Cellulose Acylate Dope>

The following composition was put into a mixing tank and stirred to dissolve each component, thereby preparing a cellulose acetate solution used as a core layer cellulose acylate dope.

| Core layer cellulose acylate dope | |
|---|---|
| Cellulose acetate having acetyl substitution degree of 2.88 | 100 parts by mass |
| Polyester compound B described in example of JP2015-227955A | 12 parts by mass |
| Compound F shown below | 2 parts by mass |
| Methylene chloride (first solvent) | 430 parts by mass |
| Methanol (second solvent) | 64 parts by mass |

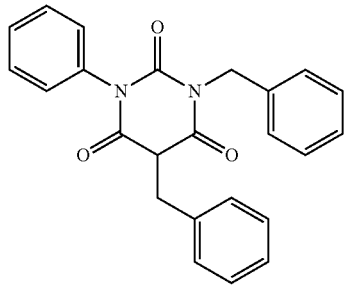

Compound F

<Preparation of Outer Layer Cellulose Acylate Dope>

10 parts by mass of the following matting agent solution was added to 90 parts by mass of the above-described core layer cellulose acylate dope, thereby preparing a cellulose acetate solution used as an outer layer cellulose acylate dope.

| Matting agent solution | |
|---|---|
| Silica particles with average particle size of 20 nm (AEROSIL R972, manufactured by Nippon Aerosil Co., Ltd.) | 2 parts by mass |
| Methylene chloride (first solvent) | 76 parts by mass |
| Methanol (second solvent) | 11 parts by mass |
| Core layer cellulose acylate dope described above | 1 part by mass |

<Preparation of Cellulose Acylate Film 1>

The core layer cellulose acylate dope and the outer layer cellulose acylate dope were filtered through filter paper having an average pore diameter of 34 μm and a sintered metal filter having an average pore diameter of 10 μm, and three layers which were the core layer cellulose acylate dope and the outer layer cellulose acylate dopes provided on both sides of the core layer cellulose acylate dope were simultaneously cast from a casting port onto a drum at 20° C. (band casting machine).

Next, the film was peeled off in a state where the solvent content was approximately 20% by mass, both ends of the film in the width direction were fixed by tenter clips, and the film was dried while being stretched at a stretching ratio of 1.1 times in the lateral direction.

Thereafter, the film was further dried by being transported between the rolls of the heat treatment device to prepare an optical film (transparent support) having a thickness of 40 μm, and the optical film was used as a cellulose acylate film 1. The in-plane retardation of the obtained cellulose acylate film 1 was 0 nm.

[Formation of Photo-Alignment Film PA1]

The cellulose acylate film 1 was continuously coated with the following coating solution PA1 for forming a photo-alignment film with a wire bar. The support on which a coating film was formed was dried with hot air at 140° C. for 120 seconds, and the coating film was irradiated with polarized ultraviolet rays (10 mJ/cm$^2$, using an ultra-high pressure mercury lamp) to form a photo-alignment film PA1, thereby obtaining a triacetyl cellulose (TAC) film with a photo-alignment film. The film thickness of the photo-alignment film PA1 was 0.5 μm.

| Coating solution PA1 for forming photo-alignment film | |
|---|---|
| Polymer PA-1 shown below | 100.00 parts by mass |
| Acid generator PAG-1 shown below | 8.25 parts by mass |
| Stabilizer DIPEA shown below | 0.6 parts by mass |
| Xylene | 1126.60 parts by mass |
| Methyl isobutyl ketone | 125.18 parts by mass |

Polymer PA-1

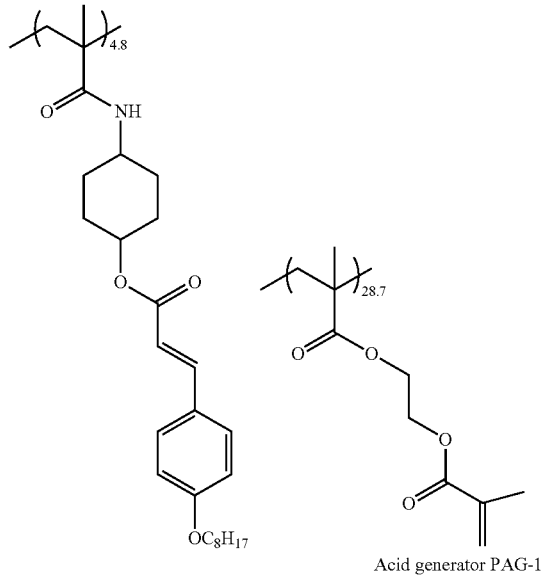

Acid generator PAG-1

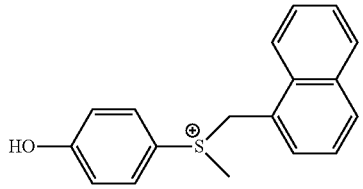

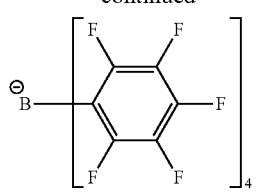

Stabilizer DIPEA

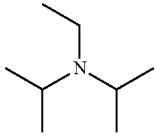

[Preparation of Polarizer Layer P1]

A coating layer P1 was formed by continuously coating the obtained photo-alignment film PA1 with a composition P1 for forming a polarizer layer with the following composition using a wire bar.

Next, the coating layer P1 was heated at 140° C. for 15 seconds, and the coating layer P1 was cooled to room temperature (23° C.).

Next, the coating layer was heated at the heating temperature listed in Table 1 for 60 seconds and cooled to room temperature again.

Thereafter, the coating layer was irradiated with an LED lamp (center wavelength of 365 nm) for 2 seconds under an irradiation condition of an illuminance of 200 mW/cm$^2$, thereby preparing a polarizer layer P1 on the photo-alignment film PA1. The film thickness of the polarizer layer P1 was 0.5 μm.

| Composition of composition P1 for forming polarizer layer | |
|---|---|
| First dichroic substance C-1 shown below | 0.59 parts by mass |
| Second dichroic substance M-1 shown below | 0.36 parts by mass |
| Third dichroic substance Y-1 shown below | 0.24 parts by mass |
| Liquid crystal compound L-1 shown below | 5.55 parts by mass |
| Polymerization initiator IRGACURE OXE-02 (manufactured by BASF SE) | 0.21 parts by mass |
| Surfactant F-1 shown below | 0.055 parts by mass |
| Cyclopentanone | 45.34 parts by mass |
| Tetrahydrofuran | 45.34 parts by mass |
| Benzyl alcohol | 2.33 parts by mass |

Dichroic substance C-1

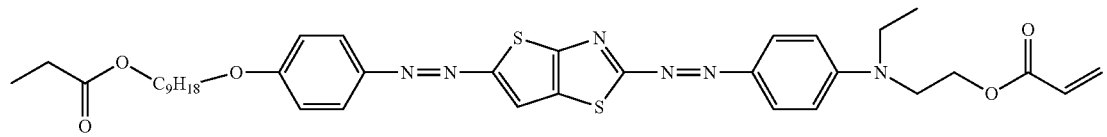

(maximal absorption wavelength: 570 nm)

Dichroic substance M-1

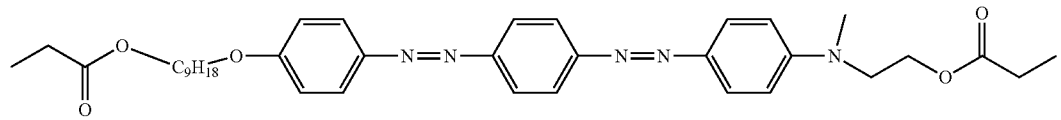

(maximal absorption wavelength: 466 nm)

Dichroic substance Y-1

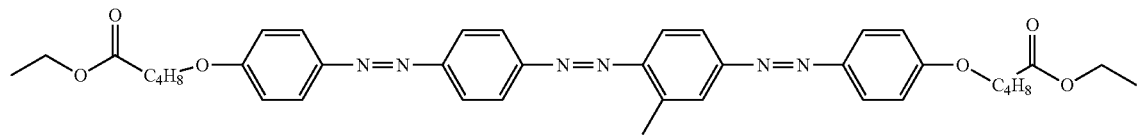

(maximal absorption wavelength: 417 nm)

Liquid crystal compound L-1

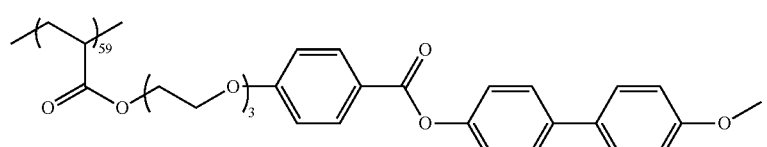

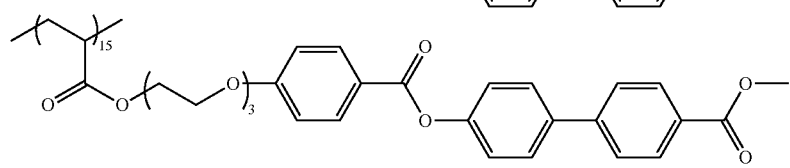

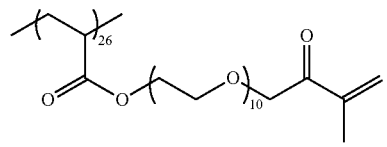

Surfactant F-1

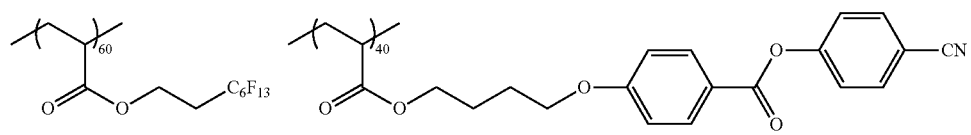

[Formation of Oxygen Blocking Layer B1]

The polarizer layer P1 was continuously coated with a coating solution B1 having the following composition with a wire bar. Thereafter, the layer was dried with hot air at 80° C. for 5 minutes, thereby obtaining a laminate A on which the oxygen blocking layer B1 consisting of polyvinyl alcohol (PVA) having a thickness of 1.0 μm was formed, that is, a laminate Ain which the cellulose acylate film 1 (transparent support), the photo-alignment film PA1, the polarizer layer P1, and the oxygen blocking layer B1 were provided adjacent to each other in this order.

| Composition of coating solution B1 for forming oxygen blocking layer | |
|---|---|
| Modified polyvinyl alcohol shown below | 3.80 parts by mass |
| Initiator Irg2959 | 0.20 parts by mass |
| Water | 70 parts by mass |
| Methanol | 30 parts by mass |

Modified polyvinyl alcohol

[Preparation of Pressure Sensitive Adhesive N1]

An acrylate-based polymer was prepared according to the following procedures.

95 parts by mass of butyl acrylate and 5 parts by mass of acrylic acid were polymerized by a solution polymerization method in a reaction container equipped with a cooling pipe, a nitrogen introduction pipe, a thermometer, and a stirrer, thereby obtaining an acrylate-based polymer (A1) with an average molecular weight of 2,000,000 and a molecular weight distribution (Mw/Mn) of 3.0.

Next, an acrylate-based pressure sensitive adhesive with the following composition was prepared using the obtained acrylate-based polymer (A1). A separate film that had been subjected to a surface treatment with a silicone-based release agent was coated with the composition using a die coater, dried in an environment of 90° C. for 1 minute, and irradiated with ultraviolet rays (UV) under the following conditions, thereby obtaining an acrylate-based pressure sensitive adhesive N1 with a film thickness of 15 μm. The composition of the acrylate-based pressure sensitive adhesive N1 is shown below.

The prepared acrylate-based pressure sensitive adhesive N1 had a moisture content of 0.60% after being allowed to stand in an environment of a temperature of 25° C. and a relative humidity of 60% for 3 days. In addition, the content of the reducing agent of the prepared acrylate-based pressure sensitive adhesive N1 was less than 0.01 g/m$^2$.

<UV Irradiation Conditions>
Electrodeless lamp H bulb (Fusion Co., Ltd.)
Illuminance of 600 mW/cm$^2$, light dose of 150 mJ/cm$^2$
The UV illuminance and the light dose were measured using "UVPF-36" (manufactured by Eye Graphics Co., Ltd.).

| Acrylate-based pressure sensitive adhesive N1 | |
|---|---|
| Acrylate-based polymer (A1) | 100 parts by mass |
| (A) Polyfunctional acrylate-based monomer shown below | 11.1 parts by mass |
| (B) Photopolymerization initiator shown below | 1.1 parts by mass |
| (C) Isocyanate-based crosslinking agent shown below | 1.0 parts by mass |
| (D) Silane coupling agent shown below | 0.2 parts by mass |

(A) Polyfunctional acrylate-based monomer: tris(acryloyloxyethyl) isocyanurate, molecular weight=423, trifunctional type (trade name, "ARONIX M-315", manufactured by Toagosei Co., Ltd.)

(B) Photopolymerization Initiator: mixture of benzophenone and 1-hydroxycyclohexyl phenyl ketone at mass ratio of 1:1, "IRGACURE 500" (manufactured by Ciba Specialty Chemicals Corp.)

(C) Isocyanate-based crosslinking agent: trimethylolpropane-modified tolylene diisocyanate ("CORONATE L", manufactured by Nippon Polyurethane Industry Co., Ltd.)

(D) Silane coupling agent: 3-glycidoxypropyltrimethoxysilane ("KBM-403", manufactured by Shin-Etsu Chemical Co., Ltd.)

[Preparation of Pressure Sensitive Adhesive N2]

A separate film that had been subjected to a surface treatment with a silicone-based release agent was coated with the acrylate-based pressure sensitive adhesive to have the following composition using a die coater and dried in an environment of 90° C. for 10 minutes, thereby obtaining an acrylate-based pressure sensitive adhesive N2 with a film thickness of 200 μm. The composition of the acrylate-based pressure sensitive adhesive is shown below. Further, p-methoxyphenol was added to improve long-term storability of the pressure sensitive adhesive, but can act as a reducing agent with respect to the azo coloring agent. The prepared acrylate-based pressure sensitive adhesive N2 contained 0.05 g/m$^2$ of p-methoxyphenol as a reducing agent.

The prepared acrylate-based pressure sensitive adhesive N2 had a moisture content of 0.25% after being allowed to stand in an environment of a temperature of 25° C. and a relative humidity of 60% for 3 days.

| Acrylate-based pressure sensitive adhesive N2 | |
|---|---|
| SK Dyne 2147 (manufactured by Soken Chemical & Engineering Co., Ltd.) | 100 parts by mass |
| p-Methoxyphenol | 0.33 parts by mass |

[Preparation of Laminate A-1 for Evaluation]

The laminate A cut into 10 cm square on the side of the oxygen blocking layer B1 was bonded to 10 cm square non-alkali glass EAGLE XG having a thickness of 1.1 mm (manufactured by Corning Inc.) using the pressure sensitive adhesive N1 cut into 10 cm squares. Next, only the cellulose acylate film 1 contained in the laminate A was removed, and the surface from which the film had been removed and the 10 cm square non-alkali glass EAGLE XG having a thickness of 1.1 mm were bonded to each other using the pressure sensitive adhesive N2 cut into 10 cm, thereby obtaining a laminate A-1. The laminate A-1 had a layer configuration of the non-alkali glass Eagle XG, the pressure sensitive adhesive layer N1, the oxygen blocking layer B1, the polarizer layer P1, the photo-alignment film PA1, the pressure sensitive adhesive layer N2, and the non-alkali glass EAGLE XG.

The content of moisture present between two sheets of non-alkali glass of the prepared laminate was measured, and the value was 0.67 g/m$^2$. Further, the total content of the reducing agent contained in the pressure sensitive adhesive layer of the prepared laminate was 0.05 g/m$^2$ or greater and less than 0.06 g/m$^2$.

Further, the moisture permeability of the non-alkali glass used for the preparation was less than $1.0 \times 10^{-1}$ g/m$^2$·day.

Example 2

A laminate A-2 was prepared by the same method as in Example 1 except that the acrylate-based pressure sensitive adhesive N2 was changed to a commercially available sheet-like pressure sensitive adhesive SA368 (manufactured by New Tac Kasei Co., Ltd.).

The sheet-like pressure sensitive adhesive SA368 had a moisture content of 0.19% after being allowed to stand in an environment of a temperature of 25° C. and a relative humidity of 60% for 3 days. In addition, the content of the reducing agent of the sheet-like pressure sensitive adhesive SA368 was less than 0.01 g/m$^2$.

The content of moisture present between two sheets of non-alkali glass of the prepared laminate was measured, and the value was 0.55 g/m$^2$.

Further, the total content of the reducing agent contained in the pressure sensitive adhesive layer of the prepared laminate was less than 0.01 g/m$^2$.

Example 3

[Preparation of Pressure Sensitive Adhesive N3]

An acrylate-based pressure sensitive adhesive N3 was obtained in the same manner as that for the acrylate-based pressure sensitive adhesive N2 except that the film thickness of the acrylate-based pressure sensitive adhesive N2 was changed to 50 μm.

The acrylate-based pressure sensitive adhesive N3 had a moisture content of 0.25% after being allowed to stand in an environment of a temperature of 25° C. and a relative humidity of 60% for 3 days. In addition, the prepared acrylate-based pressure sensitive adhesive N3 contained 0.01 g/m$^2$ of p-methoxyphenol as a reducing agent.

A laminate A-3 was prepared by the same method as in Example 1 except that the acrylate-based pressure sensitive adhesive N2 was changed to the acrylate-based pressure sensitive adhesive N3.

The content of moisture present between two sheets of non-alkali glass of the prepared laminate was measured, and the value was 0.30 g/m$^2$.

Further, the total content of the reducing agent contained in the pressure sensitive adhesive layer of the prepared laminate was 0.01 g/m² or greater and less than 0.02 g/m².

Example 4

[Preparation of Pressure Sensitive Adhesive N4]

A separate film that had been subjected to a surface treatment with a silicone-based release agent was coated with a commercially available acrylate-based pressure sensitive adhesive solution SK Dyne 2147 (manufactured by Soken Chemical & Engineering Co., Ltd.) using a die coater and dried in an environment of 90° C. for 10 minutes, thereby obtaining an acrylate-based pressure sensitive adhesive N4 with a film thickness of 200 µm.

The prepared acrylate-based pressure sensitive adhesive N4 had a moisture content of 0.25% after being allowed to stand in an environment of a temperature of 25° C. and a relative humidity of 60% for 3 days. Further, the content of the reducing agent in the prepared acrylate-based pressure sensitive adhesive N4 was less than 0.01 g/m².

A laminate A-4 was prepared by the same method as in Example 1 except that the acrylate-based pressure sensitive adhesive N2 was changed to the acrylate-based pressure sensitive adhesive N4.

The content of moisture present between two sheets of non-alkali glass of the prepared laminate was measured, and the value was 0.67 g/m².

Further, the total content of the reducing agent contained in the pressure sensitive adhesive layer of the prepared laminate was less than 0.01 g/m².

Example 5

A laminate A-5 was prepared by the same manner as in Example 1 except that the acrylate-based pressure sensitive adhesive N2 was changed to a commercially available sheet-like pressure sensitive adhesive CS9898 (manufactured by Nitto Denko Corporation). Here, the sheet-like pressure sensitive adhesive CS9898 was allowed to stand in a low-humidity environment (at 25° C. and a relative humidity of 10%) for 24 hours in advance, dehydrated, and bonded. Further, the content of the reducing agent in the sheet-like pressure sensitive adhesive CS9898 was less than 0.01 g/m².

The content of moisture present between two sheets of non-alkali glass of the prepared laminate was measured, and the value was 0.77 g/m².

Further, the total content of the reducing agent contained in the pressure sensitive adhesive layer of the prepared laminate was less than 0.01 g/m².

Example 6

The laminate A on the side of the oxygen blocking layer B1 was bonded to non-alkali glass EAGLE XG having a thickness of 1.1 mm (manufactured by Corning Inc.) using the pressure sensitive adhesive N1. Next, only the cellulose acylate film 1 contained in the laminate A was removed, and the surface from which the film had been removed and a commercially available cycloolefin polymer film (ZEONOA ZB12, film thickness of 50 µm, manufactured by Zeon Corporation) were bonded to each other. Further, the laminate on the side of the cycloolefin polymer film and the alkali glass EAGLE XG having a thickness of 1.1 mm were bonded to each other using a commercially available sheet-like pressure sensitive adhesive CS9898 (manufactured by Nitto Denko Corporation), thereby preparing a laminate A-6. The laminate A-6 had a layer configuration of the non-alkali glass EAGLE XG, the pressure sensitive adhesive layer N1, the oxygen blocking layer B1, the polarizer layer P1, the photo-alignment film PA1, the pressure sensitive adhesive layer N1, the cycloolefin polymer film ZB12, the sheet-like pressure sensitive adhesive CS9898, and the non-alkali glass EAGLE XG.

The sheet-like pressure sensitive adhesive CS9898 had a moisture content of 0.69% after being allowed to stand in an environment of a temperature of 25° C. and a relative humidity of 60% for 3 days.

The content of moisture present between two sheets of non-alkali glass of the prepared laminate was measured, and the value was 1.64 g/m².

Further, the total content of the reducing agent contained in the pressure sensitive adhesive layer of the prepared laminate was less than 0.01 g/m².

Further, the moisture permeability of the cycloolefin polymer film ZB12 was 1.8 g/m² day.

Example 7

[Formation of Photo-Alignment Film PA2]

A coating solution PA2 for forming a photo-alignment layer was prepared with the following composition, dissolved for 1 hour while being stirred, and filtered through a 0.45 µm filter. The cellulose acylate film 1 was continuously coated with the prepared coating solution PA2 for forming a photo-alignment layer using a wire bar. The support on which a coating film was formed was dried with hot air at 60° C. for 120 seconds, and the coating film was irradiated with polarized ultraviolet rays (100 mJ/cm², using an ultra-high pressure mercury lamp) to form a photo-alignment film PA2, thereby obtaining a triacetyl cellulose (TAC) film with a photo-alignment film.

| Coating solution PA2 for forming photo-alignment film | |
|---|---|
| Photoactive compound E-4 shown below | 5.0 parts by mass |
| Cyclopentanone | 95.0 parts by mass |

Photoactive compound E-4

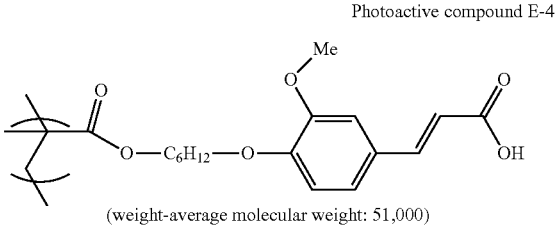

(weight-average molecular weight: 51,000)

[Preparation of Polarizer Layer P2]

A composition P2 for forming a polarizer layer was prepared with the following composition, dissolved by being heated at 80° C. for 2 hours while being stirred, and filtered through a 0.45 µm filter. The photo-alignment film PA2 was coated with the prepared composition P2 for forming a polarizer layer using a wire bar. Next, the obtained coating film was heated at 120° C. for 60 seconds and cooled to room temperature. Thereafter, the coating film was irradiated with ultraviolet rays with an exposure amount of 2,000 mJ/cm² using a high-pressure mercury lamp, thereby forming a polarizer layer P2 with a thickness of 1.7 μm. Further, it was confirmed that the liquid crystal of the polarizer layer was a smectic B phase.

| Composition P2 for forming polarizer layer | |
|---|---|
| Dichroic coloring agent D1 shown below | 0.8 parts by mass |
| Dichroic coloring agent D2 shown below | 2.6 parts by mass |
| Dichroic coloring agent D3 shown below | 2.2 parts by mass |
| Dichroic coloring agent D4 shown below | 1.8 parts by mass |
| Liquid crystal compound M1 shown below | 100.0 parts by mass |
| Polymerization initiator IRGACURE 369 (manufactured by BASF SE) | 5.0 parts by mass |
| BYK361N (manufactured by BYK-Chemie GmbH) | 0.9 parts by mass |
| Cyclopentanone | 925.0 parts by mass |

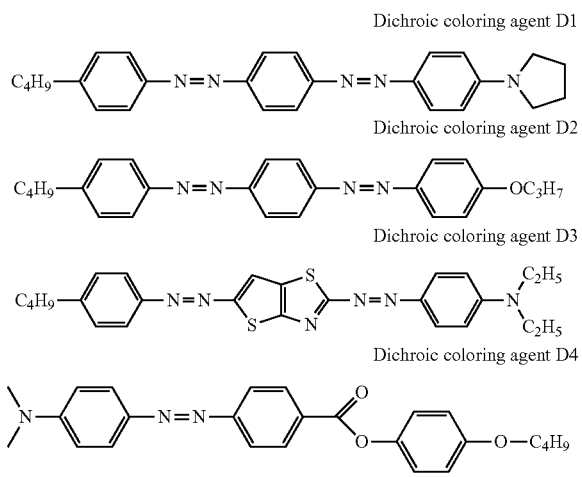

Liquid Crystal Compound M1 (Compound a and Compound B were Mixed at Mixing Ratio of 75/25)

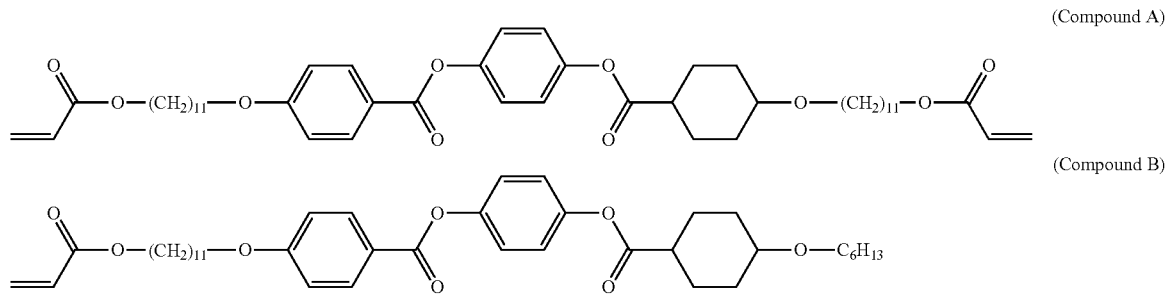

[Formation of Oxygen Blocking Layer B1]

The polarizer layer P2 was continuously coated with the above-described coating solution B1 using a wire bar. Thereafter, the layer was dried with hot air at 80° C. for 5 minutes, thereby obtaining a laminate AA on which the oxygen blocking layer B1 consisting of polyvinyl alcohol (PVA) having a thickness of 1.0 μm was formed, that is, a laminate AA in which the cellulose acylate film 1 (transparent support), the photo-alignment film PA2, the polarizer layer P2, and the oxygen blocking layer B1 were provided adjacent to each other in this order.

A laminate A-7 was prepared by the same method as in Example 2 except that the laminate A was changed to the laminate AA.

The content of moisture present between two sheets of non-alkali glass of the prepared laminate was measured, and the value was 0.55 g/m².

Further, the total content of the reducing agent contained in the pressure sensitive adhesive layer of the prepared laminate was less than 0.01 g/m².

Comparative Example 1

A laminate B-1 was prepared by the same method as in Example 1 except that the acrylate-based pressure sensitive adhesive N2 was changed to a commercially available sheet-like pressure sensitive adhesive CS9898 (manufactured by Nitto Denko Corporation).

The sheet-like pressure sensitive adhesive CS9898 had a moisture content of 0.69% after being allowed to stand in an environment of a temperature of 25° C. and a relative humidity of 60% for 3 days.

The content of moisture present between two sheets of non-alkali glass of the prepared laminate was measured, and the value was 1.55 g/m².

Further, the total content of the reducing agent contained in the pressure sensitive adhesive layer of the prepared laminate was less than 0.01 g/m².

[Evaluation: Discoloration Resistance Test]

A test (a test assuming in-vehicle applications) of allowing the laminates obtained in the examples and the comparative examples to stand in an environment of 105° C. for 500 hours was performed, and the discoloration in the central portion of each sample after the test was evaluated. The evaluation was performed according to the following indices using a spectrophotometer based on a color difference (difference in b) between the central portion and the peripheral portion (the four corners of the sample and the average of four points separated by 1 cm inside each side) of the sample that had been allowed to stand on white paper.

In a case where the evaluation result is "C" or higher, it can be determined that the durability is acceptable.

A: The color difference Ab between the central portion and the peripheral portion was less than 1.0.
   B: The color difference Ab between the central portion and the peripheral portion was 1.0 or greater and less than 1.5.
   C: The color difference Ab between the central portion and the peripheral portion was 1.5 or greater and less than 2.5.
   D: The color difference Ab between the central portion and the peripheral portion was 2.5 or greater.

The results of the above-described evaluation test are listed in Table 1.

TABLE 1

|  | Example 1 | Example 2 | Example 3 | Example 4 | Example 5 | Example 6 | Example 7 | Comparative Example 1 |
|---|---|---|---|---|---|---|---|---|
| Moisture content ($g/m^2$) | 0.67 | 0.55 | 0.30 | 0.67 | 0.77 | 1.64 | 0.55 | 1.55 |
| Total thickness of pressure sensitive adhesive layer (μm) | 215 | 215 | 65 | 215 | 215 | 230 | 215 | 215 |
| Total content of reducing agent ($g/m^2$) | 0.05 or greater and less than 0.06 | 0.01> | 0.01 or greater and less than 0.02 | 0.01> | 0.01> | 0.01> | 0.01> | 0.01> |
| Remark |  |  |  |  |  | Layer of low moisture permeability, provided between polarizer layer and pressure sensitive adhesive layer |  |  |
| Coloration at 105° C. after 500 hours | C | B | A | B | C | B | B | D |

As listed in Table 1, it was confirmed that all the laminates prepared in Examples 1 to 7 had excellent discoloration resistance.

[Preparation of Organic EL Display Device]

[Preparation of TAC Film A1 Including Positive A-Plate A1]

The cellulose acylate film 1 was continuously coated with the following coating solution PA3 for forming a photo-alignment film having the following composition using a wire bar. The support on which a coating film was formed was dried with hot air at 140° C. for 120 seconds, and the coating film was irradiated with polarized ultraviolet rays (10 mJ/cm², using an ultra-high pressure mercury lamp) to form a photo-alignment film PA3 having a thickness of 0.2 μm, thereby obtaining a TAC film with a photo-alignment film.

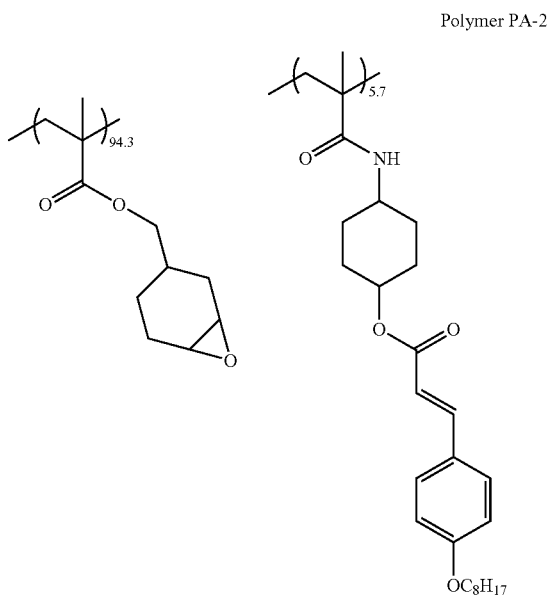

Polymer PA-2

| Coating solution PA3 for forming photo-alignment film | |
|---|---|
| Polymer PA-2 shown below | 100.00 parts by mass |
| Acid generator PAG-1 shown above | 5.00 parts by mass |
| Acid generator CPI-110TF shown above | 0.005 parts by mass |
| Isopropyl alcohol | 16.50 parts by mass |
| Butyl acetate | 1072.00 parts by mass |
| Methyl ethyl ketone | 268.00 parts by mass |

The photo-alignment film PA3 was coated with the composition A-1 having the following composition using a bar coater. The coating film formed on the photo-alignment film PA3 was heated to 120° C. with hot air, cooled to 60° C., irradiated with ultraviolet rays having a wavelength of 365 nm with an illuminance of 100 mJ/cm² using a high-pressure mercury lamp in a nitrogen atmosphere, and continuously irradiated with ultraviolet rays with an illuminance of 500 mJ/cm² while being heated at 120° C. so that the alignment of the liquid crystal compound was fixed, thereby preparing a TAC film A1 having a positive A-plate A1.

The thickness of the positive A-plate A1 was 2.5 μm, and the Re (550) was 144 nm. Further, the positive A-plate A1 satisfied the relationship of "Re (450)≤Re (550)≤Re (650)". Re (450)/Re (550) was 0.82.

| Composition A-1 | |
|---|---|
| Polymerizable liquid crystal compound LA-1 shown below | 43.50 parts by mass |
| Polymerizable liquid crystal compound LA-2 shown below | 43.50 parts by mass |
| Polymerizable liquid crystal compound LA-3 shown below | 8.00 parts by mass |
| Polymerizable liquid crystal compound LA-4 shown below | 5.00 parts by mass |
| Polymerization initiator PI-1 shown below | 0.55 parts by mass |
| Leveling agent T-1 | 0.20 parts by mass |
| Cyclopentanone | 235.00 parts by mass |

Polymerizable liquid crystal compound LA-1

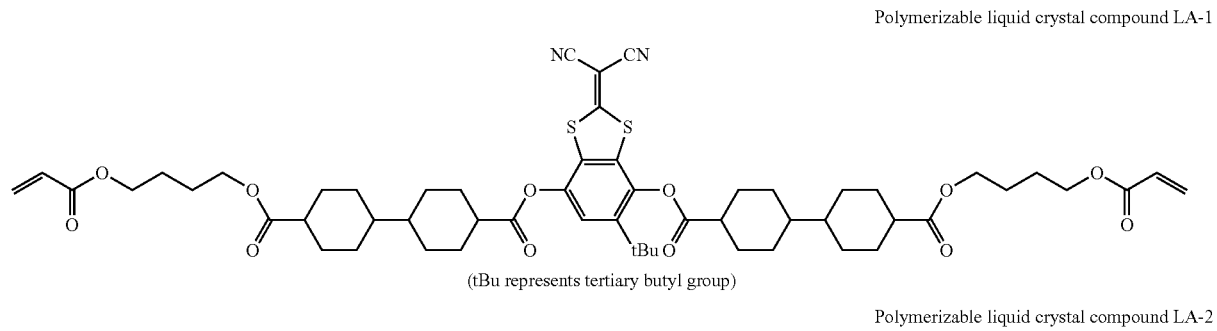

(tBu represents tertiary butyl group)

Polymerizable liquid crystal compound LA-2

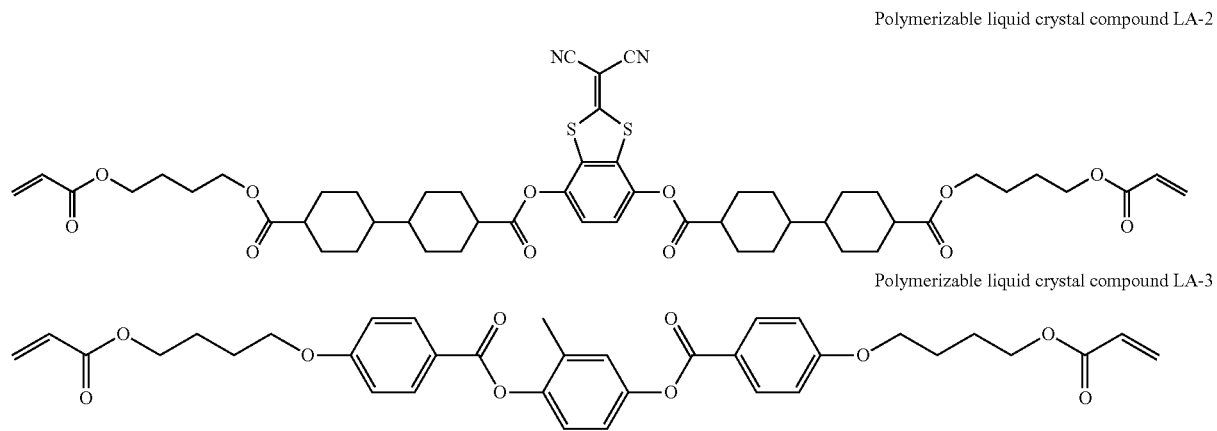

Polymerizable liquid crystal compound LA-3

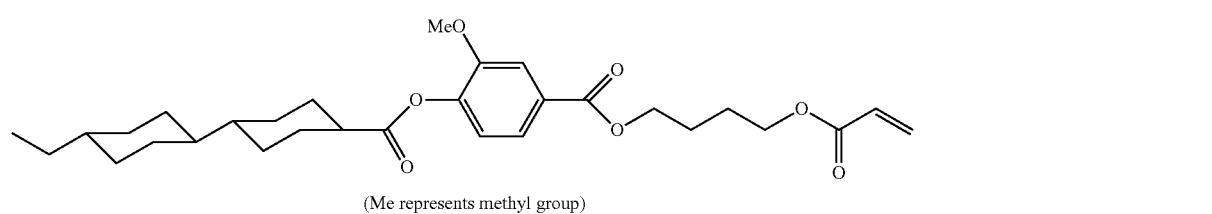

Polymerizable liquid crystal compound LA-4

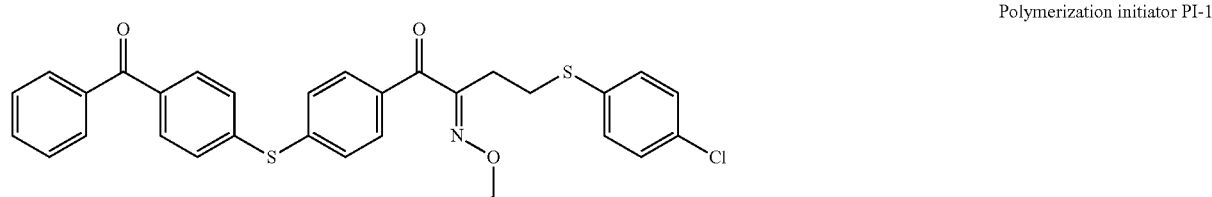

(Me represents methyl group)

Polymerization initiator PI-1

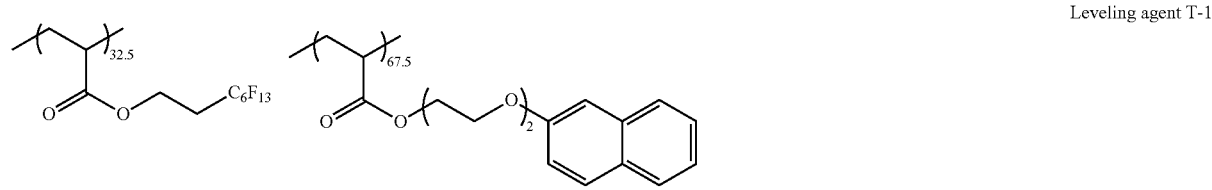

Leveling agent T-1

[Preparation of TAC Film C1 Having Positive C-Plate C1]

The above-described cellulose acylate film 1 was used as a temporary support.

The cellulose acylate film 1 was allowed to pass through a dielectric heating roll at a temperature of 60° C., the film surface temperature was increased to 40° C., one surface of the film was coated with an alkaline solution having the following composition such that the coating amount reached 14 ml/m² using a bar coater and heated to 110° C., and the film was transported for 10 seconds under a steam-type far-infrared heater (manufactured by Noritake Co., Ltd.).

Next, the film was coated with pure water such that the coating amount reached 3 ml/m² using the same bar coater.

Next, the process of washing the film with water using a fountain coater and draining the film using an air knife was repeated three times, and the film was transported to a drying zone at 70° C. for 10 seconds and dried, thereby preparing a cellulose acylate film 1 which had been subjected to an alkali saponification treatment.

| (Alkaline solution) | |
|---|---|
| Potassium hydroxide | 4.7 parts by mass |
| Water | 15.8 parts by mass |
| Isopropanol | 63.7 parts by mass |
| Fluorine-containing surfactant SF-1 ($C_{14}H_{29}O(CH_2CH_2O)_{20}H$) | 1.0 parts by mass |
| Propylene glycol | 14.8 parts by mass |

The cellulose acylate film 1 that had been subjected to the alkali saponification treatment was continuously coated with a coating solution PA4 for forming an alignment film with the following composition using a #8 wire bar. The obtained film was dried with hot air at 60° C. for 60 seconds and further dried with hot air at 100° C. for 120 seconds, thereby forming an alignment film PA4.

| Coating solution PA4 for forming alignment film | |
|---|---|
| Polyvinyl alcohol (PVA103, manufactured by Kuraray Co., Ltd.) | 2.4 parts by mass |
| Isopropyl alcohol | 1.6 parts by mass |
| Methanol | 36 parts by mass |
| Water | 60 parts by mass |

The alignment film PA4 was coated with a coating solution C1 for forming a positive C-plate with the following composition, the obtained coating film was aged at 60° C. for 60 seconds and irradiated with ultraviolet rays with an illuminance of 1,000 mJ/cm² in the air using an air-cooled metal halide lamp at an illuminance of 70 mW/cm² (manufactured by Eye Graphics Co., Ltd.), and the alignment state thereof was fixed to vertically align the liquid crystal compound, thereby preparing a TAC film C1 having a positive C-plate C1 with a thickness of 0.5 μm.

The Rth (550) of the obtained positive C-plate was −60 nm.

| Coating solution C1 for forming positive C-plate | |
|---|---|
| Liquid crystal compound LC-1 shown below | 80 parts by mass |
| Liquid crystal compound LC-2 shown below | 20 parts by mass |
| Vertically aligned liquid crystal compound S01 | 1 part by mass |
| Ethylene oxide-modified trimethylolpropane triacrylate (V#360, manufactured by Osaka Organic Chemical Industry Ltd.) | 8 parts by mass |
| IRGACURE 907 (manufactured by BASF SE) | 3 parts by mass |
| KAYACURE DETX (manufactured by Nippon Kayaku Co., Ltd.) | 1 part by mass |
| Compound B03 shown below | 0.4 parts by mass |
| Methyl ethyl ketone | 170 parts by mass |
| Cyclohexanone | 30 parts by mass |

Liquid crystal compound LC-1

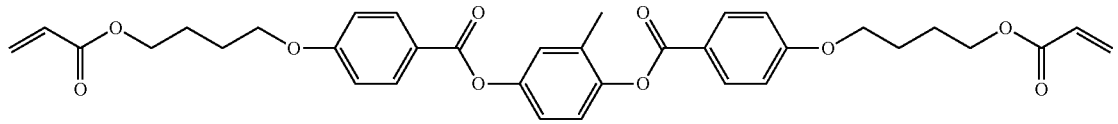

Liquid crystal compound LC-2

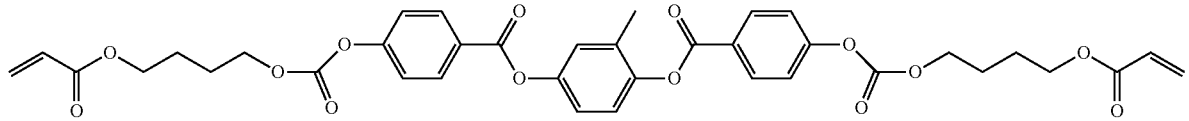

Vertically aligned liquid crystal compound S01

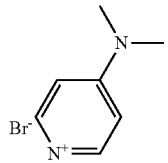

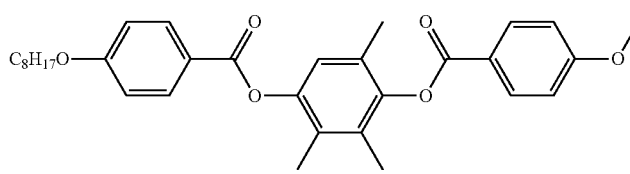

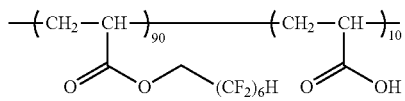

Compound B03

[Preparation of Laminate C-1 for Evaluation]

The TAC film A1 having the positive A-plate A1 on the phase difference side and the TAC film C1 having the positive C-plate C1 on the phase difference side were bonded to each other by irradiation with UV rays having a light dose of 600 mJ/cm2 using the UV adhesive composition. The thickness of the UV adhesive layer was 3 μm. Further, the surfaces bonded to each other with the UV adhesive were respectively subjected to a corona treatment. Next, the photo-alignment film PA3 on the side of the positive A-plate A1 and the cellulose acylate film 1 were removed to obtain a phase difference plate 1. Further, the layer configuration of the phase difference plate 1 is formed of the positive A-plate A1, the UV adhesive layer, the positive C-plate C1, the photo-alignment film PA4, and the cellulose acylate film 1.

The laminate A on the side of the oxygen blocking layer B1 was bonded to non-alkali glass EAGLE XG having a thickness of 1.1 μmm (manufactured by Corning Inc.) using the pressure sensitive adhesive N1. Next, only the cellulose acylate film 1 of the laminate A was removed, and the surface from which the film had been removed and the phase difference plate 1 on the side of the positive A-plate A1 were bonded to each other using the pressure sensitive adhesive N1. Next, the photo-alignment film PA4 on the side of the positive C-plate C1 and the cellulose acylate film 1 included in the phase difference plate 1 were removed, thereby preparing a laminate C-1. At this time, the films were bonded to each other such that an angle between the absorption axis of the polarizer layer P1 included in the laminate A and the slow axis of the positive A-plate A1 was set to 45°. Further, the layer configuration of the laminate C-1 is formed of the non-alkali glass EAGLE XG, the pressure sensitive adhesive layer N1, the oxygen blocking layer B1, the polarizer layer P1, the photo-alignment film PA1, the pressure sensitive adhesive layer N1, the positive A-plate A1, the UV adhesive layer, and the positive C-plate C1.

GALAXY S5 (manufactured by Samsung Electronics Co., Ltd.) equipped with an organic EL panel (organic EL display element) was disassembled, the touch panel provided with a circularly polarizing plate was peeled off from the organic EL display device, and the circularly polarizing plate was further peeled off from the touch panel so that the organic EL display element including a glass substrate, the touch panel, and the circularly polarizing plate were isolated from each other. Subsequently, the isolated touch panel was bonded to the organic EL display element again, and the laminate C-1 on the side of the positive C-plate C1 which had been prepared above was bonded onto the touch panel using the pressure sensitive adhesive N2 such that air did not enter, thereby preparing an organic EL display device.

The display performance of the prepared organic EL display device was evaluated under bright light. Specifically, the display screen of the display device was set to be displayed in black, and reflected light in a case of projecting fluorescent light on the front surface at a polar angle of 45 degrees was observed, and as a result, the color was black and coloration was not visually recognized, and excellent display performance was exhibited.

What is claimed is:

1. A laminate comprising:
two substrates; and
a polarizer layer disposed between the two substrates,
wherein the laminate further comprises at least one pressure sensitive adhesive layer disposed between the two substrates,
wherein the polarizer layer contains one or more kinds of azo coloring agents having two or more azo bonds in a molecule,
moisture permeabilities of the two substrates are $10^{-3}$ g/m²·day or less,
a content of moisture present between the two substrates is 0.9 g/m² or less, and
wherein each at least one pressure sensitive adhesive layer has a thickness of 100 μm or greater.

2. The laminate according to claim 1,
wherein the content of moisture present between the two substrates is 0.7 g/m² or less.

3. The laminate according to claim 1,
wherein the content of moisture present between the two substrates is 0.4 g/m² or less.

4. The laminate according to claim 1,
wherein a total content of a reducing agent in the at least one pressure sensitive adhesive layer is 0.04 g/m² or less.

5. The laminate according to claim 1,
wherein both the two substrates are glass substrates.

6. The laminate according to claim 1,
wherein the two substrates each have a thickness of 100 to 1,100 μm.

7. The laminate according to claim 1,
wherein the azo coloring agent is a compound represented by Formula (1),

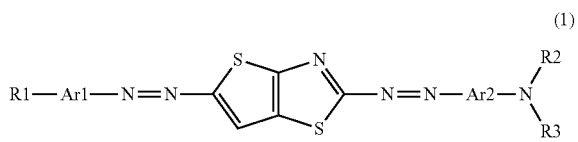

(1)

in Formula (1), Ar1 and Ar2 each independently represent a phenylene group which may have a substituent or a naphthylene group which may have a substituent,
in Formula (1), R1 represents a hydrogen atom or an alkyl group, an alkoxy group, an alkylthio group, an alkylsulfonyl group, an alkylcarbonyl group, an alkyloxycarbonyl group, an acyloxy group, an alkylcarbonate group, an alkylamino group, an acylamino group, an alkylcarbonylamino group, an alkoxycarbonylamino group, an alkylsulfonylamino group, an alkylsulfamoyl group, an alkylcarbamoyl group, an alkylsulfinyl group, an alkylureido group, an alkylphosphoric acid amide group, an alkylimino group, or an alkylsilyl group, which may have a substituent,
in Formula (1), R2 and R3 each independently represent a hydrogen atom or an alkyl group, an alkenyl group, an alkoxy group, an acyl group, an alkyloxycarbonyl group, an alkylamide group, an alkylsulfonyl group, an aryl group, an arylcarbonyl group, an arylsulfonyl group, an aryloxycarbonyl group, or an arylamide group, which may have a substituent, and R2 and R3 may be bonded to each other to form a ring, and R2 or R3 may be bonded to Ar2 to form a ring.

8. An image display device comprising:
the laminate according to claim 1.

9. A laminate comprising:
two substrates;
a polarizer layer disposed between the two substrates;
at least one layer of low moisture permeability, disposed between the two substrates; and
at least one pressure sensitive adhesive layer disposed between the two substrates,
wherein the polarizer layer contains one or more kinds of azo coloring agents having two or more azo bonds in a molecule,
moisture permeabilities of the two substrates are $10^{-3}$ $g/m^2 \cdot day$ or less,
the at least one layer of low moisture permeability is disposed between the polarizer layer and the at least one pressure sensitive adhesive layer,
a moisture permeability of the at least one layer of low moisture permeability is 20 $g/m^2 \cdot day$ or less, and
wherein each at least one pressure sensitive adhesive layer has a thickness of 100 μm or greater.

10. The laminate according to claim 9,
wherein the at least one layer of low moisture permeability contains a cyclic polyolefin-based resin.

11. The laminate according to claim 9,
wherein a total content of a reducing agent in the at least one pressure sensitive adhesive layer is 0.04 $g/m^2$ or less.

\* \* \* \* \*